(12) United States Patent
Weaver et al.

(10) Patent No.: US 10,222,438 B2
(45) Date of Patent: Mar. 5, 2019

(54) SYSTEM AND APPARATUS FOR COMBINED MAGNETIC RESONANCE IMAGING WITH MAGNETIC SPECTROSCOPY OF BROWNIAN MOTION AND/OR MAGNETIC NANOPARTICLE IMAGING

(71) Applicant: The Trustees of Dartmouth College, Hanover, NH (US)

(72) Inventors: John B. Weaver, Hanover, NH (US); Alexander Hartov, Enfield, NH (US)

(73) Assignee: THE TRUSTEES OF DARTMOUTH COLLEGE, Hanover, NH (US)

( * ) Notice: Subject to any disclaimer, the term of this patent is extended or adjusted under 35 U.S.C. 154(b) by 772 days.

(21) Appl. No.: 14/440,268

(22) PCT Filed: Nov. 1, 2013

(86) PCT No.: PCT/US2013/068082
§ 371 (c)(1),
(2) Date: May 1, 2015

(87) PCT Pub. No.: WO2014/071196
PCT Pub. Date: May 8, 2014

(65) Prior Publication Data
US 2015/0276902 A1      Oct. 1, 2015

Related U.S. Application Data

(60) Provisional application No. 61/721,378, filed on Nov. 1, 2012, provisional application No. 61/780,882, filed on Mar. 13, 2013.

(51) Int. Cl.
*A61B 5/055*      (2006.01)
*G01R 33/48*      (2006.01)
*G01R 33/12*      (2006.01)

(52) U.S. Cl.
CPC ..... *G01R 33/4808* (2013.01); *G01R 33/1276* (2013.01)

(58) Field of Classification Search
CPC ......... A61B 5/0515; A61B 5/05; A61B 5/055; A61B 1/00158
See application file for complete search history.

(56) References Cited

U.S. PATENT DOCUMENTS

| 2004/0066190 A1 | 4/2004 | Ju et al. |
| 2009/0115415 A1* | 5/2009 | Weaver .................... A61B 5/05 324/309 |

(Continued)

FOREIGN PATENT DOCUMENTS

WO      2012023098      2/2012

OTHER PUBLICATIONS

PCT Patent Application PCT/US2013/068082 International Search Report and Written Opinion 8 pages, dated Nov. 1, 2013.

*Primary Examiner* — Patricia J Park
(74) *Attorney, Agent, or Firm* — Lathrop Gage LLP

(57) ABSTRACT

A system for measuring responses of magnetic nanoparticles has static magnetic bias field along first axis, and AC driving coils providing AC magnetic field along second axis perpendicular to the first axis, both fields passing through an imaging zone. Sensing coils are oriented to sense fields parallel to the first axis, but not parallel to the second axis. A processor determines responses of nanoparticles in the imaging zone to the AC field. Another system has DC bias on first axis and AC driving coils providing an AC magnetic field along a second axes, magnetic gradient oriented along the first and/or second axis, and the second axis is rotated mechanically or electronically. The signal processor provides a voxel-based model of magnetic nanoparticle distribution in imaging zone. In some embodiments, the static (Continued)

magnet is a main magnet of a magnetic resonance imaging system.

22 Claims, 16 Drawing Sheets

(56) References Cited

U.S. PATENT DOCUMENTS

| | | |
|---|---|---|
| 2009/0160441 A1 | 6/2009 | Dohata et al. |
| 2010/0232075 A1* | 9/2010 | Zhou .................... G01N 24/088 360/324.12 |
| 2011/0098558 A1* | 4/2011 | Weaver .................... A61B 5/05 600/420 |
| 2011/0181273 A1 | 7/2011 | Iida et al. |
| 2012/0146645 A1 | 6/2012 | Rasche et al. |

* cited by examiner

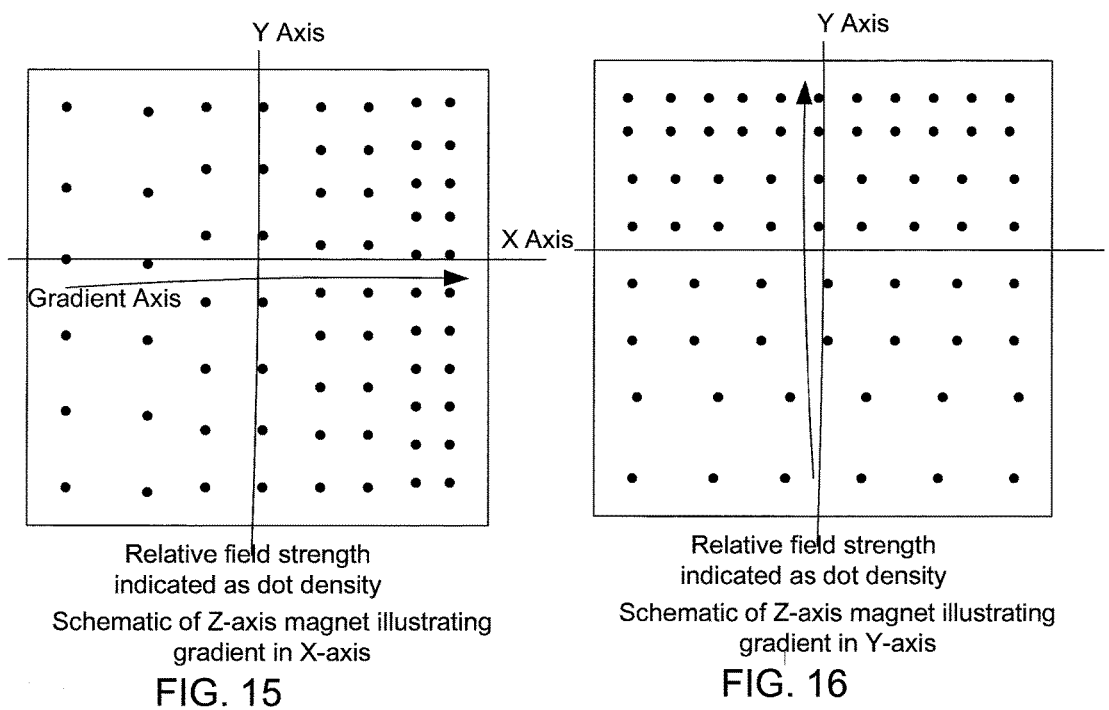
FIG. 15 Schematic of Z-axis magnet illustrating gradient in X-axis
Relative field strength indicated as dot density
FIG. 16 Schematic of Z-axis magnet illustrating gradient in Y-axis
Relative field strength indicated as dot density

SYSTEM AND APPARATUS FOR COMBINED MAGNETIC RESONANCE IMAGING WITH MAGNETIC SPECTROSCOPY OF BROWNIAN MOTION AND/OR MAGNETIC NANOPARTICLE IMAGING

CROSS-REFERENCE TO RELATED APPLICATIONS

The present application claims benefit of priority to U.S. Patent Application 61/721,378, filed Nov. 1, 2012, entitled: System And Apparatus For Combined Magnetic Resonance Imaging With Magnetic Spectroscopy Of Brownian Motion And/Or Magnetic Nanoparticle Imaging, and to U.S. Patent Application 61/780,882, filed Mar. 13, 2013, and also entitled: System And Apparatus For Combined Magnetic Resonance Imaging With Magnetic Spectroscopy Of Brownian Motion And/Or Magnetic Nanoparticle Imaging. Each of the above-mentioned applications is incorporated herein by reference.

GOVERNMENT INTEREST

This invention was made with government support under grant no. CA151662 awarded by the National Institutes of Health. The government has certain rights in the invention.

FIELD

The present document describes apparatus for generating medical information and images through magnetic spectroscopy of Brownian motion (MSB) and/or magnetic nanoparticle imaging, nearly simultaneously with nuclear magnetic resonance imaging.

BACKGROUND

Technologies for imaging and sensing using both tagged and plain nanoparticles have become of interest for use in medical imaging, and for treatment of certain disorders.

Nanoparticles may be tagged with bioactive molecules. Proteins and other molecules, such as nucleic acids, often have active sites that are capable of binding compounds of interest, or analytes, with great specificity. These analytes may be substances, such as nucleic acids or proteins, found in the bloodstream or interstitial fluid of tissues, or that may appear on cell surfaces. Nanoparticles tagged with a bioactive molecule, such as an enzyme, antibody, aptamer or other molecule, capable of selectively binding such analytes are known.

Nanoparticles, whether plain or tagged, may also be present in, or leak from, or be trapped in vasculature. In particular, they may leak from vasculature damaged by, or grown in response to presence of, tumors.

Magnetic nanoparticles, nanoparticles formed with either a core, or a layer, of a magnetic material such iron, an iron alloy, or iron oxide, can be located within a subject because of their magnetic properties.

It is known that small nanoparticles undergo a random motion induced by impact with randomly moving molecules called Brownian motion. Brownian motion can be detected and monitored with a technique called Magnetic Spectroscopy of nanoparticle Brownian Motion (MSB), described in an article published as A. M. Rauwerdink, J. B. Weaver, "Measurement of Molecular Binding Using The Brownian Motion of Magnetic Nanoparticle Probes" Applied Physics Letters 96, 033702 (2010) and on the web in Feb. 1, 2010 issue of Virtual Journal of Biological Physics Research. The method also appears on the web at http://engineering.dartmouth.edu/reu/documents/CharlieTsai_FinalReport.pdf (Tsai), and for which a copy is attached as an appendix hereto, the contents of which are incorporated herein by reference. It is also known that Brownian motion is a function of particle size, with larger, heavier, particles exhibiting smaller displacements than smaller, lighter, particles.

A basic, prior, MSB apparatus 100 is illustrated in FIG. 1. Tissue 102 that may contain magnetic nanoparticles is placed near at least one AC magnetic field driving coil 104, and may be placed between two such driving coils. In this apparatus, driving coils 104 are driven by AC field driver electronics 106, such that driving coils 104 operate as an electromagnet providing an AC magnetic field to tissue 102. One or more sensing coils 108 are provided between driving coils 104 and tissue 102, changes in the magnetic field at sensing coil 108 induce currents in coil 108, these induced currents are processed by sense amplifier and signal processing electronics 110. Nanoparticles in tissue 102 change magnetic coupling between the driving coils 104 and sensing coils 108, and Brownian motion of the nanoparticles in turn modulates that coupling, causing changes in the induced currents. Balancing coils 112 may also be provided to sense the applied AC magnetic field without influence from the nanoparticles, a signal from the balancing coils 112 may in some systems be used by electronics 110 to help isolate changes in signal from sensing coil 108 due to nanoparticles in the tissue 102. Electronics 110 produces a signal 114 representing a signal component at the sensing coils 108 due to the presence of the nanoparticles.

Since a major component of signal at the sensing coils 108 is due to the magnetic field applied by the driving coils 104, in the apparatus of Tsai the sensing coil and balancing coil are placed in series with balancing coil reversed, such that in the absence of tissue and nanoparticles 102 induced voltages in sensing and balancing coils largely cancel. In previous versions of the system it was found difficult to balance the sensing 108 and balancing coils 112 very closely so the residual is generally the limit on the sensitivity of the system.

A basic prior or traditional Magnetic Particle Imaging (MPI) system 150, as illustrated in FIG. 2, has a pair of bias-field magnets 148 oriented in opposition to each other to create a nonuniform magnetic field within the space to be occupied by tissue and nanoparticles. System 150 also has multiple sets 152, 154, 156 of driving coils and sensing coils, with each set oriented on or parallel to a different coil axis, such as Y axis 158, X axis 160, and Z axis 162. These systems are typically arranged, and magnets powered, such the vector sum of fields from each coil produce a zero field point, or "field free point" (FFP) 165 that is located within the tissue and nanoparticles to be examined. When AC driving coils are energized, the FFP will move in a cyclical manner under the influence of the driving coils, and traditional MPI signals depend on nanoparticles located where the FPP passes.

Traditional MPI systems also have DC offset magnets 170, 172, 174. Since fields in tissue are the vector sum of applied fields, and these DC offset magnets are controllable, these offset magnets effectively permits application of magnetic fields along many axes, such as axis 160, in addition to coil axes 156, 158. These magnets are controlled to scan the zone of cyclically moving FFP through tissue, thereby permitting the system to scan the tissue. MPI signals as read by the sensing coils are recorded and used to build a three dimensional map of NP distribution in the tissue.

In FIG. 2 balancing coils, driving electronics, and sensing electronics are omitted for clarity.

Traditional MPI systems rely on the FPP being literally a field-free point, where the vector sum of all applied fields, including fields from bias magnets 148, DC offset magnets 170, 172, 174, and AC driving coils, is zero. MRI imaging systems typically have a strong main magnet, with field strength ranging from about 0.2 Tesla to 3 Tesla, or even more. These main magnetic fields are strong enough that it is difficult to overcome them with DC offset magnets to produce an FPP in the tissue. For this reason, it has heretofore been thought impossible to integrate MRI and MPI for near-simultaneous dual-mode imaging.

In traditional MPI, magnetization induced by an alternating magnetic field (drive field) allowed magnetic nanoparticles (mNPs) to be imaged. Prior MPI using the FFP obtained high sensitivity by recording signal at harmonics of the AC driving field, so the signal caused by the magnetization can be isolated from the signals caused by the drive field. High sensitivity allows very low amounts of mNPs to be detected. Further, spatial selectivity was obtained from saturating the signal from mNPs at all other locations than the FFP. The FFP was scanned to produce a sequence of responses at voxels, the image being derived from signal at each voxel.

A limitation of this current MPI implementation is that high gradients are required to achieve images with reasonable resolution. Gradients of 3T/m to 9T/m are required, this requires intense fields if a volume is to be scanned that is large enough for human subjects to fit in the field.

It has not been thought possible to obtain a signal from sense coils oriented perpendicular to the alternating magnetic field because mNPs in an alternating magnetic field alone produce no magnetization perpendicular to the alternating field.

A conventional MRI machine has a large magnet (main magnet) that provides a very strong static bias field in an imaging zone, into which a subject is placed for imaging. The main magnet may be a C-shaped permanent magnet as in some smaller "open-MRI" systems, it may be a superconducting toroidal electromagnet, or may have some other configuration. Also provided in a standard MRI machine are a radio-frequency signal source with transmitter coils, antennae or emitters for applying a radio-frequency electromagnetic field to portions of the subject within the bias field, and receiver antennae or coils and electronics for measuring any response due to resonance of protons in the bias field. Additional, controllable, magnets are provided that create gradients in that field during capture of each MRI image, allowing resonance to be swept along the gradients by sweeping radio-frequency stimulus frequencies, and thereby helping to localize resonances and thereby image tissues.

Magnetic nanoparticles have been coated with proteins or other molecules capable of selectively binding to analytes. When such particles are in suspension, a change in Brownian motion as measured by MSB can be detected when the particles are exposed to the analytes.

SUMMARY

A system for measuring responses of magnetic nanoparticles has a static magnetic bias field along first axis, and AC driving coils providing an AC magnetic field along a second axis perpendicular to the first axis, both fields passing through an imaging zone. Sensing coils are oriented to sense fields parallel to the first axis, but not parallel to the second axis. A processor determines MSB response of nanoparticles in the imaging zone to the AC field. Another system has either or both the AC driving coils and the static field/sensing coils combination rotating either electronically or physically. The signal processor provides a voxel based model of magnetic nanoparticle distribution in imaging zone. In embodiments, the static magnet has strength at least two ten thousandths tesla. In some embodiments, the static magnet is a main magnet of a magnetic resonance imaging system.

A system for measuring a response of magnetic nanoparticles has a static magnet providing a bias field oriented on first axis, and AC driving coils configured to provide an AC magnetic field along second axis, both fields passing through an imaging zone, and the second axis perpendicular to the first axis. The system also has at least one sensing coil between imaging zone and poles of the static magnet oriented to sense fields parallel to the first axis, while not sensing fields parallel to the second axis. A signal processing subsystem is configured to determine an MSB response of nanoparticles in the imaging zone to the AC magnetic field based upon the signal from the sensing coil.

A method of producing magnetic nanoparticle data includes applying a unidirectional DC bias magnetic field along a first axis to nanoparticles in a sensing zone, applying an AC magnetic field along a second axis to the nanoparticles, the second axis perpendicular to the first axis, then, while both the DC and AC magnetic fields are applied, sensing a response from the nanoparticles with a sensing coil oriented to respond primarily to field perturbations along the first axis, while minimizing response to field perturbations along the second axis; and processing the sensed response to provide the nanoparticle data.

BRIEF DESCRIPTION OF THE FIGURES

FIG. 15 is an illustration of a Z-axis magnet pole showing a field strength gradient in X axis.

FIG. 16 is an illustration of a Z-axis magnet pole showing a field strength gradient in X axis.

DETAILED DESCRIPTION OF THE EMBODIMENTS

There are advantages to locating and sensing nanoparticles (NPs) within seconds or minutes of using complimentary imaging technologies, such as nuclear Magnetic Resonance Imaging (MRI). It is particularly desirable that nanoparticle location and imaging be performed without moving or repositioning of the patient between NP imaging or sensing and complimentary imaging, because soft tissues are readily deformed, and knowing relative positions of NPs and the many structures visible in complimentary images can be important for treatment decisions and for locating tumors during later surgical treatment.

The present invention results from understanding that a static field can be used to decouple the alternating applied drive field from the pickup coil used to detect the magnetization. This allows a more sensitive system because it is no longer necessary to reduce the effects of the drive field in the pickup coils and the associated detection chain. Decoupling the two also allows the base harmonic to be measured which is difficult to do when the drive field is at the same frequency and oriented in the same direction because of strong coupling from driving coils to sensing coils when the driving and sensing coils are oriented along the same axis.

Figure 1:
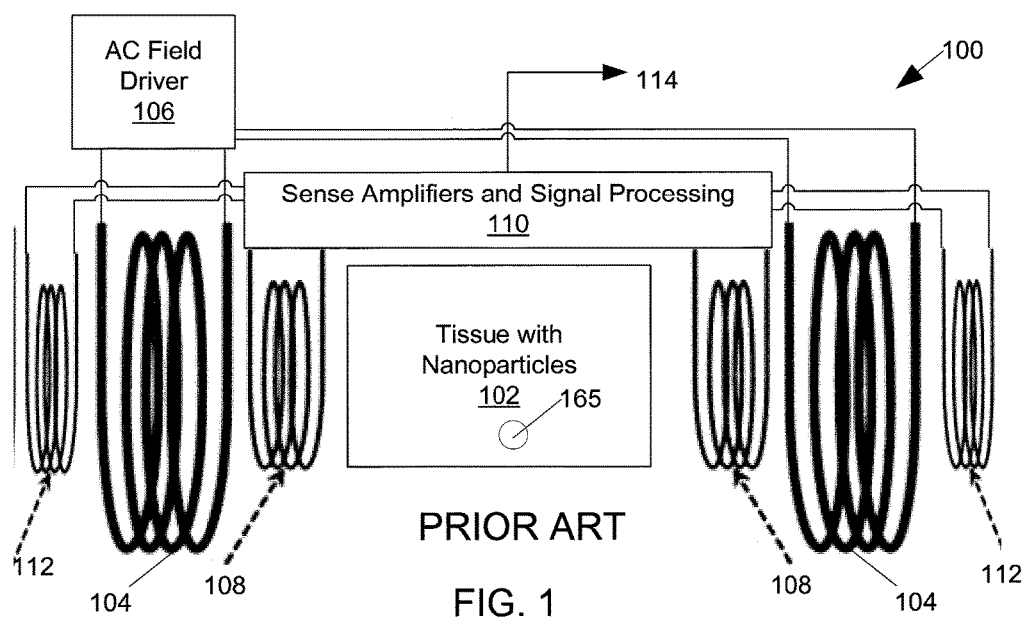
FIG. 1 is a schematic illustration of a prior Magnetic Spectroscopy of Brownian Motion (MSB) system having paired driving and sense coils.
Figure 2:
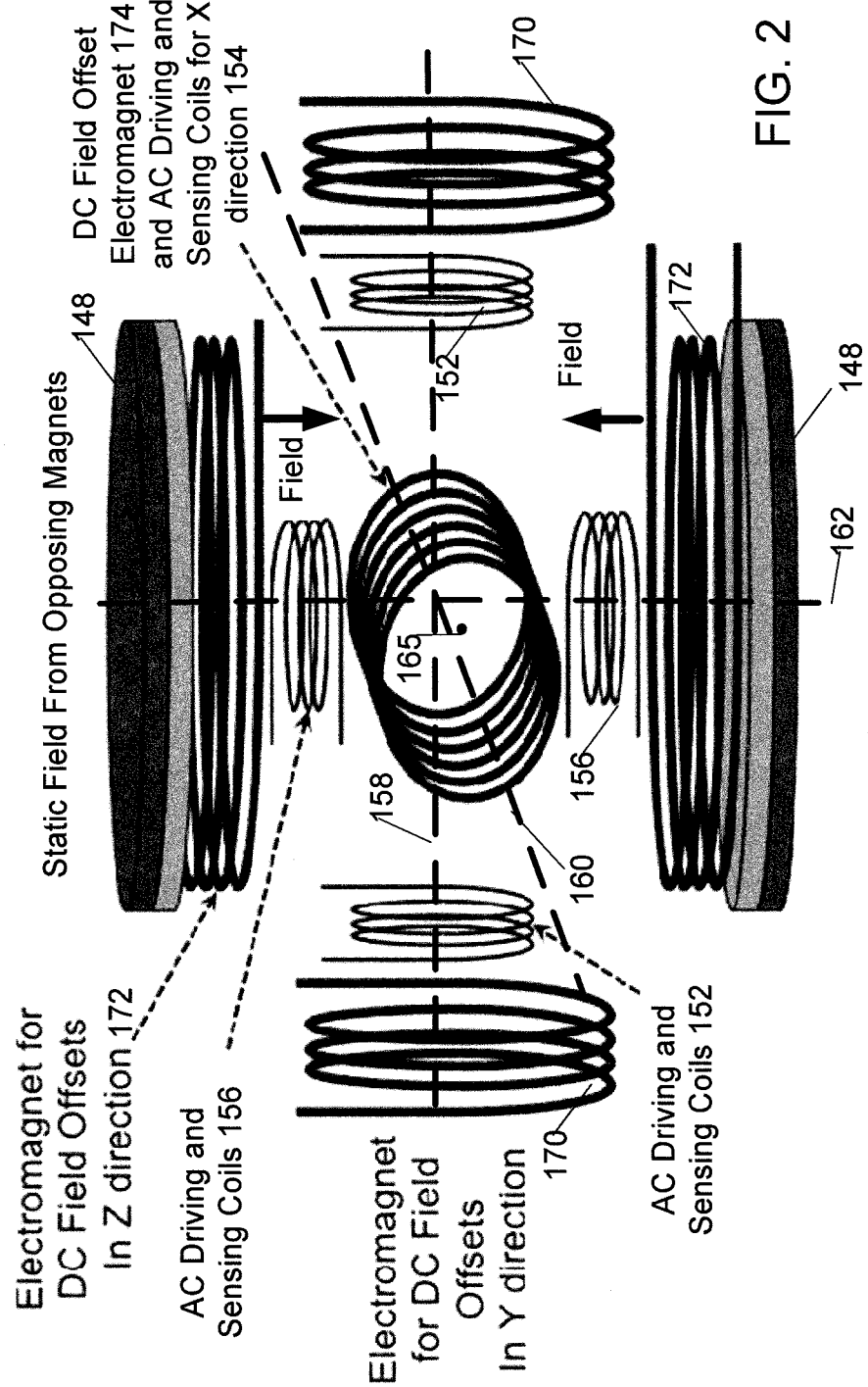
FIG. 2 is a schematic illustration of a prior Magnetic Particle Imaging (MPI) system illustrating two sets of the multiple driving and sensing coils.
Figure 3:
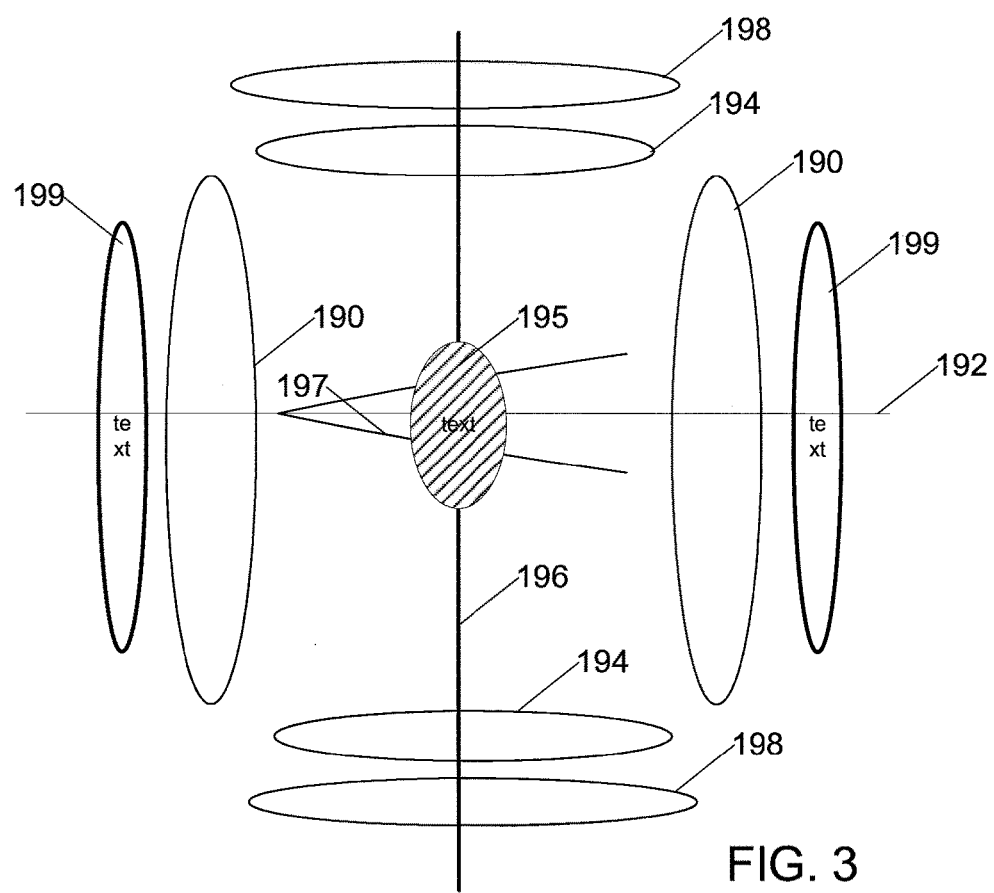
FIG. 3 is a simplified schematic illustration of an embodiment of the magnetic particle imaging system of present invention.
Figure 10:
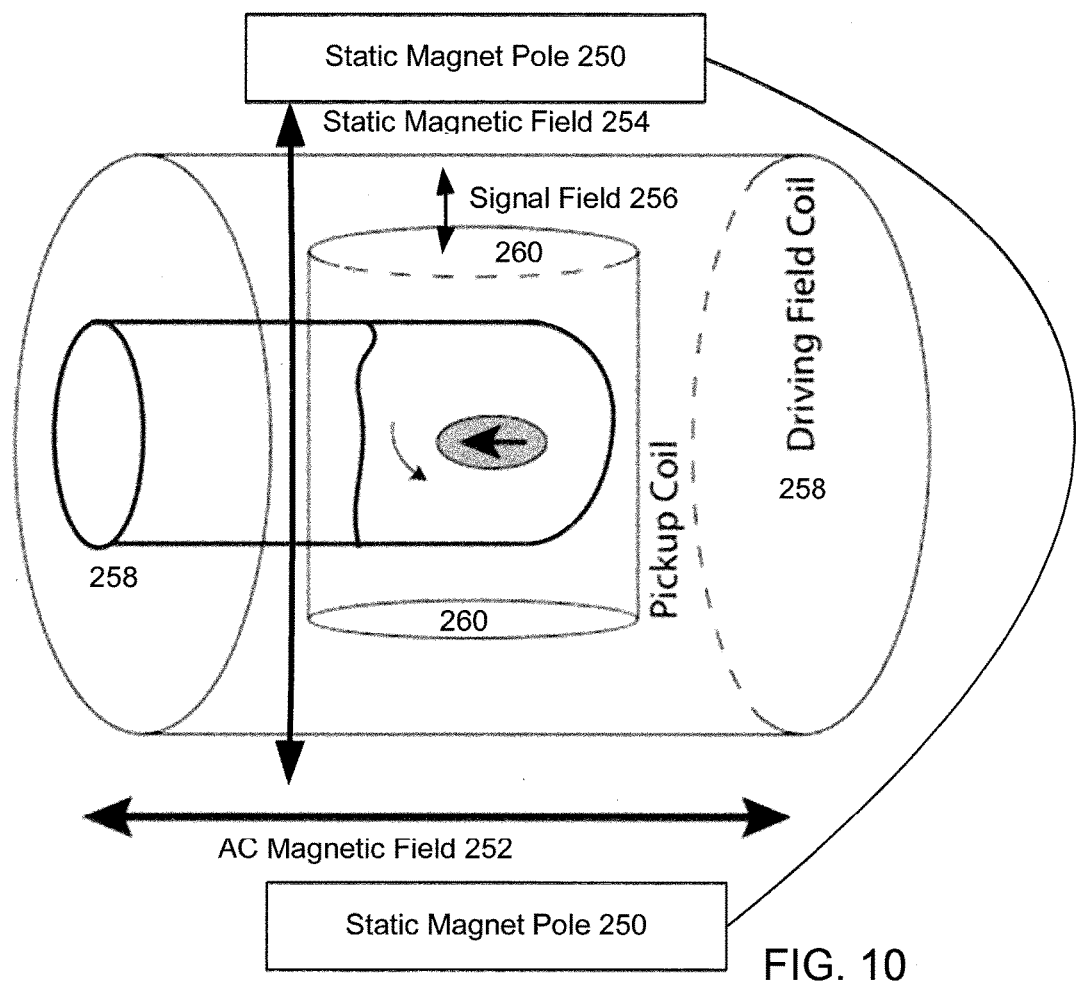
FIG. 10 is a schematic representation of the magnetic fields achieved in the apparatus resembling that of FIG. 7 or FIG. 8, showing one set of driving coils.

A basic outline of a new machine for measuring and detecting magnetic nanoparticles is illustrated schematically in FIGS. 3 and 10. This basic system can be used as a spectrometer for MSB measurements. Gradient fields can be added to make the system an imaging system. A pair of drive coil electromagnets 190 are oriented on one axis 192 (FIG. 3). A pair of sense coils 194 are oriented on a perpendicular axis 196, along with a pair of static field bias coils 198. In this embodiment, the bias coils 198 provide a static magnetic bias field through the imaging volume. Magnetic core material may be provided to focus the fields and guide conduction of fields external to the imaging volume between the coils, this core material is not shown in the figures for simplicity. However, a small static field provided by the bias coils 198 provides a preferential direction for the mNPs as they pass through the plane perpendicular to the alternating field. So the static field produces a magnetization pulse every time the alternating field goes through zero, pulling the mNPs from one orientation to the other orientation. Henceforth, we will term the magnetization pulse in the direction perpendicular to the alternating field as the "pulse". The frequency of the pulses is twice that of the alternating field. If the strength of the alternating field is much larger than the static field, the pulses are very sharp and have a very short duration while the alternating field is small compared to the static field. The sense coils respond to the pulse by providing a detected alternating current signal at second or higher harmonics of a frequency of the alternating field.

The applied alternating field is completely decoupled from coils measuring the pulses by simple geometry rather than by frequency. This geometric decoupling is attractive because filters used to separate different frequencies are limited in their effectiveness. The static field produces no signal in the coils measuring the pulses because voltages are only induced by changing magnetic fields. So there are no extraneous signals produced in coils measuring the pulses allowing high gain and high sensitivity to be achieved. The sensitivity should allow the very small magnetizations produced by the relatively small AC fields when the nanoparticles are almost saturated by the static field of an MRI to be measured.

In an embodiment, spatial localization of nanoparticles is achieved by using the standard MPI moving field free point.

Figure 6:
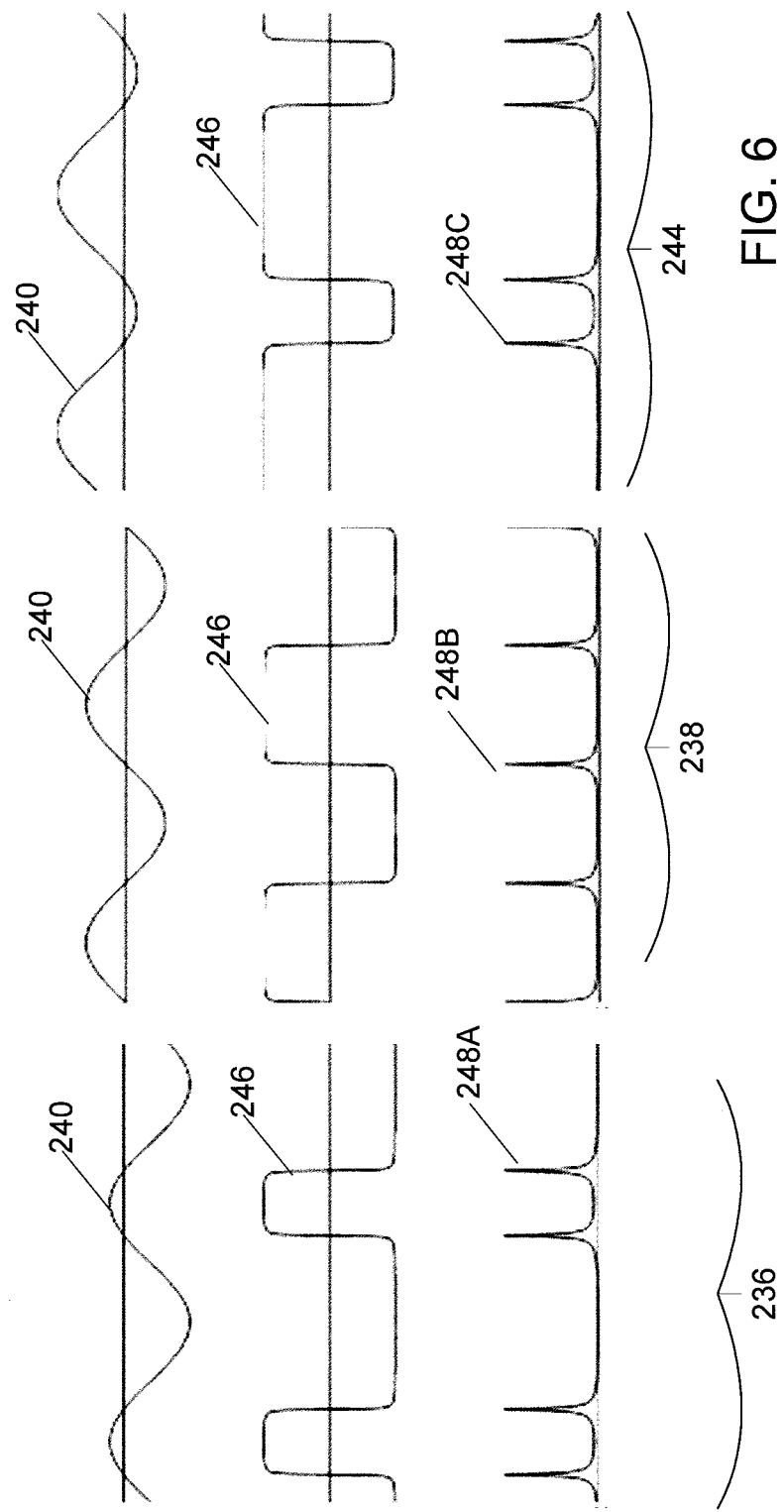
FIG. 6 is a timing diagram of waveforms of the magnetic particle imaging system of the present invention illustrating how received signals change with position along a magnetic field gradient.

In another embodiment, spatial localization of nanoparticles is achieved by changing the time that the pulses occur by imposing a static magnetic field gradient 197 oriented in the same direction as the alternating field but changing in magnitude along one of the three axes, such as may be produced by current in gradient coils 199, such that the AC drive field, static bus field, and gradient field superimpose on tissue containing the nanoparticles in an experimental volume 195. The pulses occur when the alternating field passes through zero so adding a small static magnetic field gradient 197 in the same direction as the alternating field changes the time the pulse created by mNPs at each position. As illustrated in FIG. 6, where an AC field 240 is shown superimposed on a static field gradient 242 for magnetic nanoparticles having positions with negative gradient field 236, neutral gradient field 238, and positive gradient field 244. The magnetic nanoparticles orient in the AC field as indicated at 246, resulting in a pulses 248 detected by sensing coils 194. The pulses 248A, 248B, 248C occur when the total of the alternating field and the gradient passes through zero. That is also the time that the net magnetic field passes through zeros as well. The times the pulses occur are unique to the mNPs position along the gradient, as illustrated, with pulses 248A from nanoparticles in negative gradient field being clearly distinguishable from pulses 248B from nanoparticles in neutral gradient field and pulses 248C from nanoparticles in positive gradient field.

In embodiments, localization is also be achieved by using gradients with fields in the direction of the static field. The magnitude and sign of the pulses is changed by changing the sign and amplitude of the static field. In some embodiments, a combination of the two gradient systems is also used. Initial data suggests that the gradients with fields in the same direction as the AC field produce the smallest pulses and the most accurate localization information with the highest spatial resolution for a given amplitude gradient.

Figure 7:
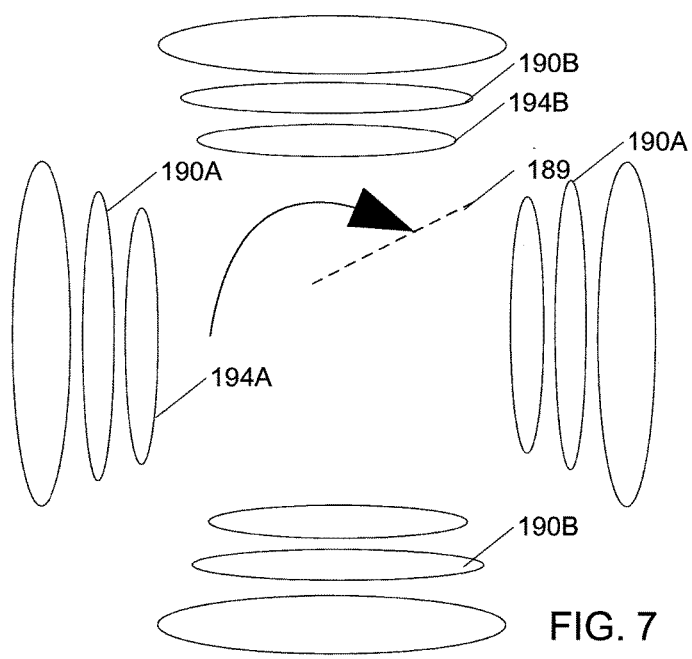
FIG. 7 is an illustration of an embodiment that synthetically rotates drive, bias, and/or sensing coils about a subject having tissue containing nanoparticles by controlling ratios of drive energy to multiple coils.

We have found that the gradient can be in any direction so a 3D image can be obtained by taking the signal for a range of directions and using a Radon transform reconstruction. The key is that a relatively small gradient is required. The gradient may be imposed by a single set of coils that rotate about tissue 195, together with sensing 194, bias 198, and drive 190 coils, in an imaging zone or an experimental volume. In alternate embodiments, the tissue is rotated within the coils to achieve an effect similar to that of rotating the coils around tissue. Similarly, in another, synthetic rotation, embodiment the effect of rotating a single set of coils about tissue is achieved synthetically. In the synthetic embodiment, coils of each of drive, sensing, and bias coils types are provided on two or more axes. Since the net magnetic field at any location is a vector sum of fields at that location, drive and bias fields are electronically steered to accomplish a rotation. In electronic steering, a drive field of a particular direction is synthesized by providing appropriate ratios of drive currents to drive coils on two or more axes as illustrated in FIG. 7, for example if drive coil sets, such as set 190A and set 190Bs, are provided on both X and Y perpendicular axes, a drive field along an axis, such as axis 189 between the X and Y axes, is synthesized by driving the X and Y drive coils with appropriate currents. Similarly, sensing can be steered or rotated by multiplying currents from two or more sets of sense coils 194A, 194B by angle-dependent constants, and summing the products. Similarly, gradient fields may be generated along an arbitrary axis by providing appropriate currents in multiple gradient coils.

It is also anticipated that gradient and drive field coils can also be merged into a single set of coils along each axis with appropriate currents; in such an embodiment an appropriate current may be a sum of a gradient current and an AC drive current in each coil.

Figure 8:
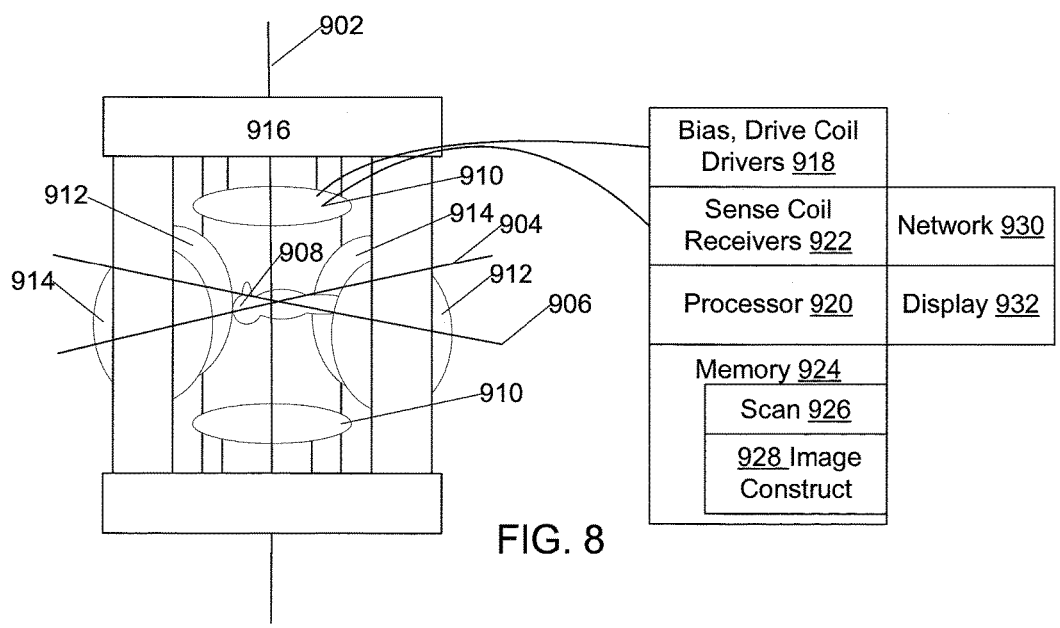
FIG. 8 is an illustration of a stand-alone MPI embodiment capable of three-dimensional image construction, the images representing nanoparticle concentrations.

In an embodiment of a stand-alone MPI system for constructing three dimensional images of magnetic nanoparticle concentrations, as illustrated in FIG. 8, the system applies the static bias field along a Z axis 902, and initially applies drive currents and a magnetic field gradient along an X axis 904; the X, Y (906), and Z axes being mutually perpendicular and passing through an imaging volume including tissue of a subject 908. Sets of drive, sense, and bias coils are provided for each axis, coils 910 on the Z axis, 912 on the X-axis, and 914 on the Y-axis; the coils mounted to an iron frame 916 for controlling magnetic fields outside the imaging volume. Bias and drive coils of coil sets 910, 912, 914 are controlled and powered by a bias and coil drivers 918 controlled by a processor 920. Detected signals from sense coils of coil sets 910, 912, 914 are received through sense coil receivers 922 into processor 920. Processor 920 operates under control of a memory 924 that contains a set of scan and data gathering routines 926, and a set of image construction routines 928. The system applies a bias field along a first axis, such as the Z axis using Z-axis coil set 910, as driven by bias and drive coil drivers 918, and an AC drive field and static in-line gradient as previously described along a second axis using one or more of X and Y coil sets 912, 914. Magnetic nanoparticle responses are sensed and timing of pulses measured by sense coil receivers 922 using sense coils of the first axis, such as in z-axis coil set 910; data from this sensing and time measuring is stored in memory 924. The second axis is then rotated by changing ratios of X and Y coil drive, and additional data obtained by sensing and timing pulses as measured by sense coil receivers 924. Yet more additional data is obtained by biasing and sensing along the X axis, while driving and providing a gradient along a third rotating axis using the drive coils of the Z and Y axis coil sets. Processor 920 then constructs a voxel-based model of the subject and fits the model to the acquired data to generate a 3-dimensional image of the nanoparticle distributions in the subject. This image is then transferred to a medical records database over a network 930 and/or displayed on a display 932, where the image may be useful for diagnostic purposes.

In an alternative embodiment, instead of, or in addition to, data gathered with a magnetic field gradient along an X axis parallel to AC drive fields along the X axis with static field along the Z axis; data is gathered with a gradient in the static field along the Z axis. The gradient may be unipolar, or may be a bipolar magnetic gradient having a null-field zone. In such an embodiment, pulse heights and directions are a function of the Z-axis magnetic field strength at each nanoparticle, and hence the position of nanoparticles along the Z-axis.

Figure 9:
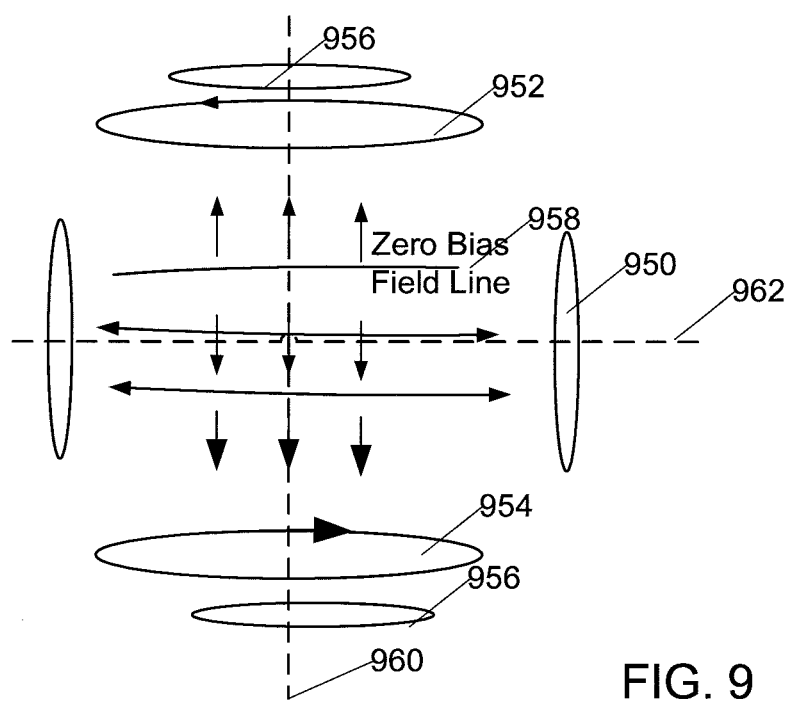
FIG. 9 is an illustration of an embodiment with a bipolar gradient in Z axis, and AC drive in an X-axis, where a zero-field plane is swept along the Z axis while taking data.

In an embodiment having X-axis 962 drive coils 950 and Z-axis bias coils 952, 954 with Z-axis gradients, pulse-height and pulse direction is recorded along with pulse timings to provide data for image construction. In a particular embodiment, as illustrated in FIG. 9, the Z-axis field gradient is bipolar, having a zero-field plane 958 that is swept through a series of positions along the Z axis 960 by adjusting currents in the Z axis bias coils, while data is taken on pulse heights, directions, and timing, as recorded by sense coils 956, to provide data useful for detailed image reconstruction in the processor. Although the sense coils are adjacent to the Z-axis bias field coils, slow changes in gradient will not induce significant artifacts in data recorded from sense coils. In an embodiment, the swept Z-axis gradient is combined with an X-axis gradient.

In the embodiment of FIG. 9, the X-axis may be rotated synthetically or electronically to gather yet more data, while sweeping the Z axis gradient at each X-axis position. The roles of X and Z axis may then be swapped to gather yet more data useful in locating nanoparticles.

In a general case, an AC drive along a first axis and a static field along a second axis may be combined with magnetic fields oriented along either the first axis and/or second axis, with gradients along the first or second axes, or along a third axis mutually perpendicular to the first and second axes. After gathering a dataset, these gradients may then be dynamically changed and additional data recorded. Any one of the axes may then be rotated electronically, or swapped with another axis, and yet more data recorded. All recorded data is useful in fitting nanoparticle locations to a 3-dimensional voxel-based model of the tissue. In some embodiments, the combinations of magnetic field gradients results in a null-bias-field zone that may be swept or scanned through tissue of a subject; it should be noted, however, that the null-field zone is a zone of minimum nanoparticle response to the AC drive field, not a zone of maximum response as is common in prior MPI technologies.

In stand-alone MPI-MSB systems, it is anticipated that the alternating field for the perpendicular field system (most recent) might be 80 millitesla with a one tenth millitesla bias field strength.

It is anticipated that the magnetic particle imaging system herein described may stand alone, or may be combined with an MRI machine as a combined MRI-MPI embodiment.

In an MRI-MPI-MSB embodiment, A new dual-mode imaging device 200 (FIG. 4) combines an existing MRI system with additional circuitry for magnetic particle imaging MPI through Magnetic Spectroscopy of NP Brownian Motion (MSB). The system may be used to obtain MRI images as known in the MRI art. Components of the MRI system include a powerful main magnet with poles 202, between which a static bias field exists, and within which a subject and/or tissue 204 may be placed. While a C-shaped magnet is illustrated as used in some open-MRI systems, the main magnet may be a superconducting toroid as used in many traditional MRI machines; for purposes of FIG. 4, it is assumed that the main magnet provides a field vertically oriented on the page along axis 222. The system includes gradient magnets 206 for trimming and applying gradients to the bias field applied to an imaging zone, as well as radio-frequency emitters 208 and receiver antennae 210 as known in the MRI art. Also provided are gradient magnet driving, radio frequency source, and radio frequency receiving electronics 212, and an MRI image reconstruction computer 214, also as known in the MRI art.

The dual-mode imaging device 200 also includes AC magnetic driving coils 216 coupled to be driven by an AC signal source 218 operable at a much lower frequency than the radio frequency of emitters 208, in some embodiments the frequency of signal source 218 is an audio frequency. The driving coils 216 are arranged to provide an AC magnetic field along an axis 220 perpendicular to an axis 222 between the poles 202 of the MRI main magnet and passing through the imaging zone. MSB AC sensing coils 224 are configured to sense changes in magnetic fields within the imaging zone along the axis 222 between pole pieces 202, and are provided for sensing an MSB signal, or a nanoparticle polarity-switch pulse signal, produced by interactions of the AC magnetic field along axis 220 with magnetic nanoparticles in subject and/or tissue 204. Coils 224 are coupled to signal receiver and sense amplifier electronics 226; electronics is coupled to processor 228 which is configured to perform spectral analysis and image reconstruction based upon signals from coils 224. Sense amplifier electronics 226 and processor 228 together form a signal processing subsystem for determining an MSB response from signals form coils 224.

In a particular embodiment using a 1.5 Tesla main magnet, the AC drive magnetic field strength may be approximately 100 millitesla, During MRI imaging, the AC driving coils 216 might not be driven to avoid interference with the MRI imaging. MRI images are obtained as known in the art of MRI imaging.

The main magnet field of a typical MRI machine is somewhat intense. In an embodiment where the MRI main-magnet field is aligned with the Z axis, gradients are introduced in that field along the Z axis, an X axis aligned with AC drive coils, and/or along a Y axis perpendicular to the X and Z axes. Once data is taken, the X axis may be mechanically or electronically rotated, and additional data taken, such additional data is useful in image generation wherein the processor fits nanoparticle concentrations of voxels in a 3-dimensional model of tissue to recorded data recorded from the sense coils.

Within a short time before or after obtaining one or more MRI images, which may be as short as a few milliseconds and preferably less than a few minutes, and without moving the subject or tissue 204, the alternating uniform drive field is used to induce an alternating magnetization from the nanoparticles and the static field provided by the MRI system's main magnet is used to guide the magnetization through the axis of the pickup or sensing coils 224. This works similarly to the system described with reference to FIGS. 3 and 6, with the MRI system's main magnet providing a static bias field. AC signal source 218 is then activated to provide an AC magnetic field. Sensing coils 224 pick up any MSB (or in variants with more magnets and coils sufficient to provide a strong gradient, an MPI) signal, which is amplified by sense electronics, including ac signal receivers 226, as preconditioned by auto adjustment DACs 227, and processed by processor 228 to provide MSB, and in some embodiments MPI, information, which is then annotated onto images provided by the MRI computer 214.

When operated in an MSB mode, where spectral analysis of the signal picked up by the sensing coils 224 is performed by processor 228, spectra determined by processor 228 depend on properties of the microenvironment in which NPs are located, including the temperature, viscosity, chemical binding and rigidity of the matrix to which the NPs are bound. The system therefore can provide a signal indicative of temperature at those locations within tissue or subject 204 where NPs are located, or, if tagged NPs are present, may provide indication of presence or absence, of particular substances such as tumor antigens.

When operated in an MPI mode, using additional sets of driving coils 216 at various angles with respect to each other but remaining perpendicular to the static field, and additional coils (not shown) for shaping the magnetic field with gradients, nanoparticle locations are mapped within tissue or subject 204.

When operated in a combined MPI-MSB mode, the presence or absence of particular substances such as tumor antigens, or distribution of particular substances to which tagged NPs may bind, are mapped within tissue or subject 204.

Figure 5:
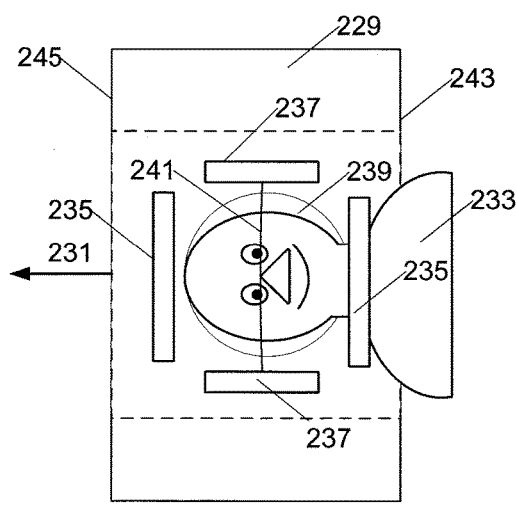
FIG. 5 is a schematic illustration of a combined MRI and MSB system utilizing a solenoid main magnet.

In an alternative embodiment, as illustrated in FIG. 5, an MRI having a solenoid-type magnet 229, cut away to show a subject 233 and coils within a cavity of the magnet, the magnet providing a static axial bias magnetic field 231. The pickup or sense coils 235 are oriented to detect any signal superimposed on the axial magnetic field 231. At least one set of AC driving coils 237 are located on an axis 241 perpendicular to the magnetic field 231, in some embodiments additional sets of AC driving coils 239 are located along different axes also perpendicular to the static magnetic field 231.

Figure 4:
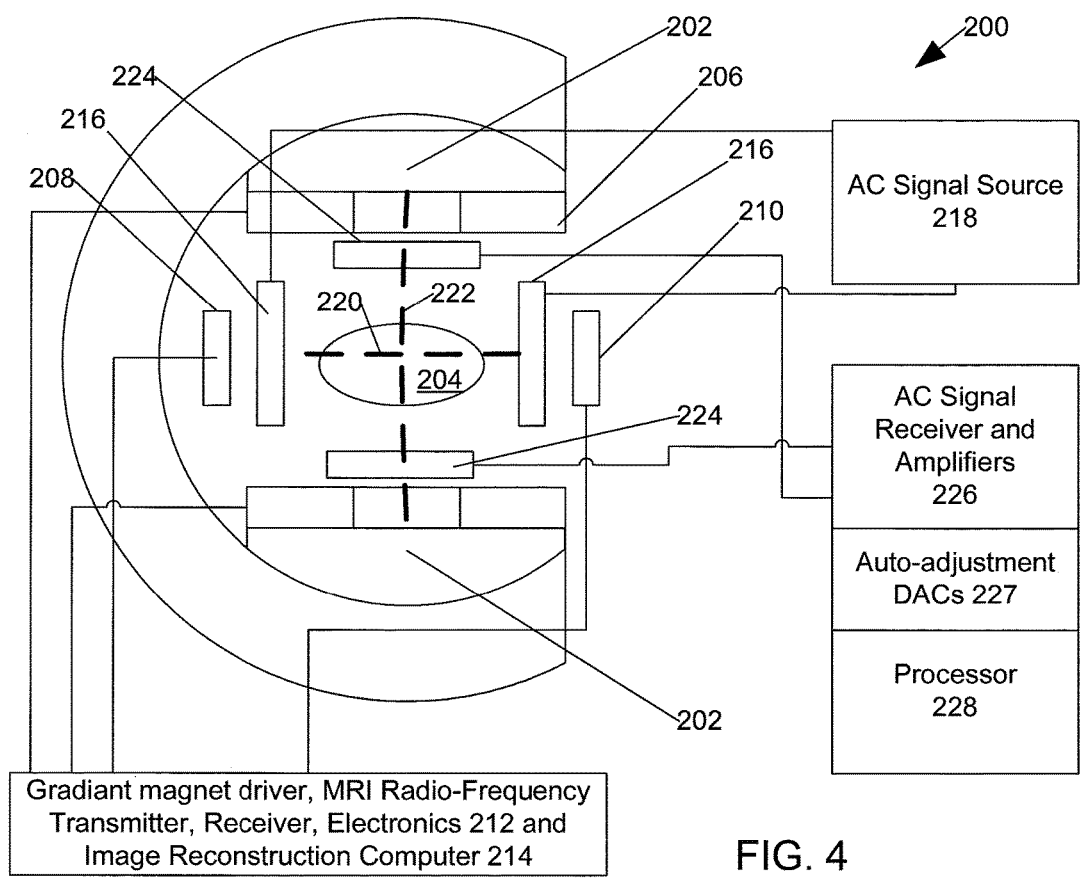
FIG. 4 is a schematic illustration illustrating a combined MRI and MSB system, with MSB sensing coils aligned with static field provided by the MRI system magnets and MSB driving coils at right angles to the static field.

It should be noted that in many of the embodiments of FIG. 4, 10, 12, or 13, the magnet poles 202, 243, 245, 250, 251 are of opposite polarity, with one pole a "north" pole and the other a "south" pole, in order to produce a unidirectional field. In the embodiments of FIGS. 4 and 5, where magnet 202 or 229 is a main magnet of an MRI machine, it is anticipated that the bias field provided by magnet 202 or 229 has strength of at least two tenths Tesla, and in most embodiments between two tenths and three Tesla. In stand-alone embodiments, such as FIG. 18, it is anticipated that the bias field provided by the bias magnet is of one tenth millitesla (0.0001 Tesla) or more, and in a particular embodiment two tenths millitesla or more.

It is contemplated that in an alternate embodiment, MRI imaging components other than the main magnet 202 may be omitted in a machine for providing MSB/MPI data and images alone without near-simultaneous MRI imaging.

The central principle behind this system and method is that the NP magnetization in an alternating magnetic field can be guided through a preferential perpendicular direction allowing the magnetization to be detected in the direction perpendicular to the alternating applied field. A static magnetic field is used to guide the magnetization as it flips back and forth. That static magnetic field can be the static magnetic field of the MRI system as provided by main magnet 202 for MRI-based multimodality systems (MRI/MSB, MRI/MPI and MRI/MPI/MSB). Or it can be an independently applied static field for a standalone system.

Fields applied by the system are illustrated schematically in FIG. 10, including a static or bias field 254 between pole pieces 250 of the main magnet, an alternating magnetic field 252 between AC driving coils 258, and a weak MPI/MSB signal field 256 that can be detected by sensing coils 260.

Figure 11:
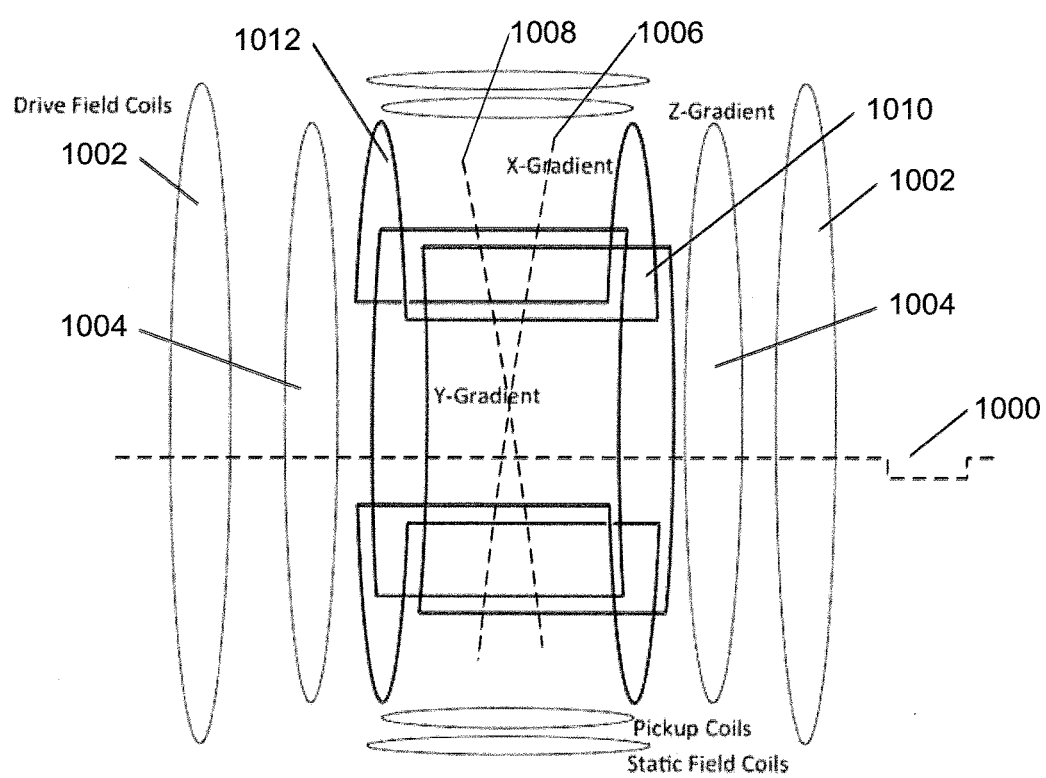
FIG. 11 is a schematic representation of fields in a combined MPI-MRI system.

Fields applied by a particular embodiment of a combined MPI-MRI system having a conventional superconducting toroidal main magnet, such as is common with 1.5 Tesla imaging machines, are illustrated in FIG. 11. The Z axis 1000 is oriented along the toroidal main magnet. AC driving coils 1002 are located along the Z axis, with Z-axis gradient coils 1002, and with X axis 1006 and Y axis 1008 gradients applied by X 1010 and Y 1012 gradient coils to a subject (not shown) located axially in the toroid. Three-dimensional images can be produced by using three gradient systems (all with fields in the same direction as the drive field but varying in magnitude in the three directions). The signal is still produced by using a static field in a perpendicular direction (or directions) and a pickup coil (or combination of pickup coils in the same direction as the perpendicular static field. The gradient system would essentially be that of an MRI system, permitting rapid retrofitting of MRI machines.

The techniques work by oscillating the NPs in an applied magnetic field, such as that from driving coils 216, and then measuring the signal that is produced in a pickup or sensing coil 224, due to the changing flux produced by the NPs' magnetization. However, if this driving field is a pure sine wave, and the signal from the NPs will not be in general, then we can look at their contribution to the signal through the higher harmonics (i.e. distortion in the magnetization).

The perpendicular measurement achieved with the system of FIG. 3 and field arrangements of FIG. 10 allows the base frequency magnetization to be measured as well as the higher harmonics because the driving field is perpendicular to the sensing coils 224 and thus does not contribute to the changing magnetic flux as measured by the sensing coils 224. Without the static field, there is no reason to expect the particles to rotate preferentially in either horizontal (x) direction, and thus the total flux contribution from the particles would average out to zero. By using the static field, we break the symmetry of the situation, and force the particles to only rotate in the left half of the y-plane so that the total flux will not cancel itself.

The detected signal in traditional MSB is a combination of the current produced by the applied field including distortions produced by the amplifier and the current produced by the NP magnetization. The detected signal in the systems proposed herein, as for example in FIGS. 3 and 10, 17 and 18, have sensing coils oriented at right angles to the AC driving coils so the current produced in sensing coils by the applied AC field is almost eliminated, leaving current produced by the NP magnetization. A static field produces no current in the coil because the voltage is proportional to the time derivative of the magnetic flux. So orienting a static field perpendicular to the alternating field isolates the messy sources of current associated with the applied field from the detected signal allowing much higher sensitivity. MPI uses the same signals MSB used so the same technique can be used to isolate the applied field from the signal detection can be used in that technology as well.

Figure 12:
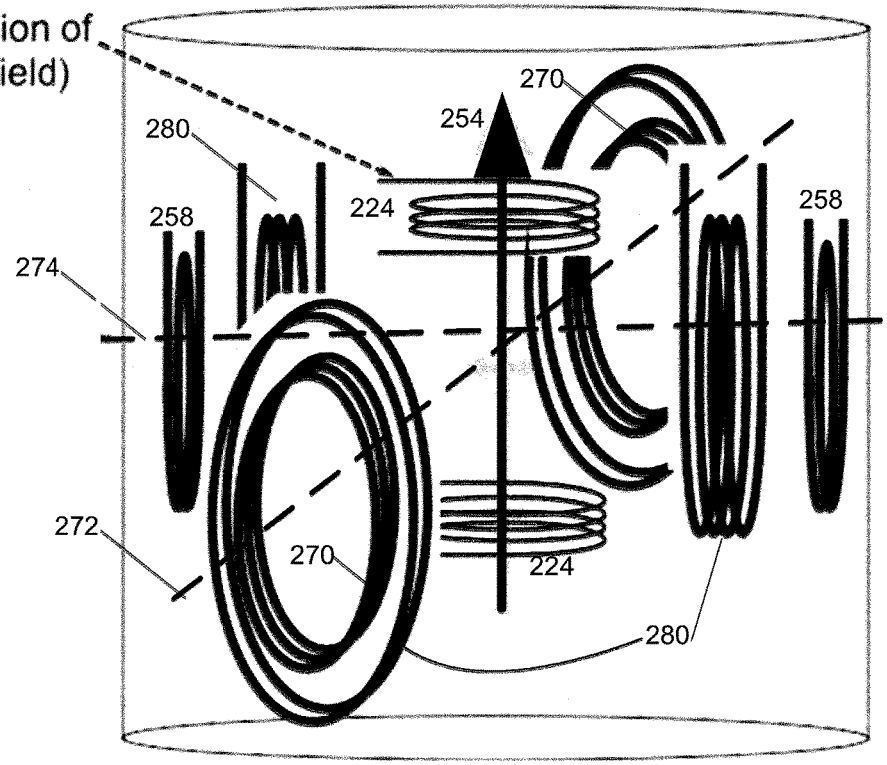
FIG. 12 is a schematic representation of magnets and magnetic fields in an apparatus resembling that of FIG. 7 or FIG. 8, showing multiple sets of driving coils on axes at multiple angles, for MPI or MSB/MPI.
Figure 13:
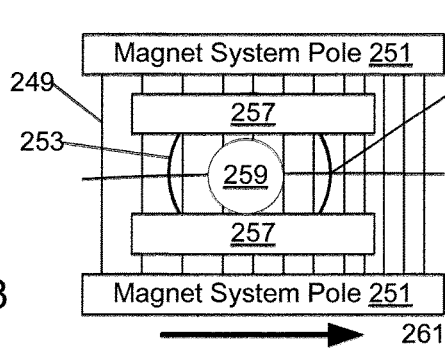
FIG. 13 is a schematic illustration of field gradients in a system for performing MPI.

As illustrated in FIG. 12, the system may have additional sets of AC driving coils 270 on an axis 272 that is perpendicular to the bias field between main magnet poles 250, but at an angle A relative to the axis between the axis 274 defined by the first set of AC driving coils 258. Additional electromagnets 280 may be present to provide magnetic field gradients as may become necessary.

It is expected that magnetic field gradients, such as may be produced by additional gradient electromagnets, will prove useful in localizing nanoparticles and providing MPI or MSB-MPI images, going beyond MSB alone. It is desirable that the effective concentration of magnetic lines of force 249 (FIG. 13) increase in the direction 261 of the gradient, but remain as aligned as possible with an axis between poles 251 of the magnet system, as are an axis of pickup or sensing coils 257. This gradient permits resolution along on an axis 255 perpendicular to the axis between poles 251 and along an axis of the gradient. AC driving coils 253 are aligned on an axis (not shown as directly into the page) that is perpendicular to the axis between poles 251 of the magnet system.

Figure 17:
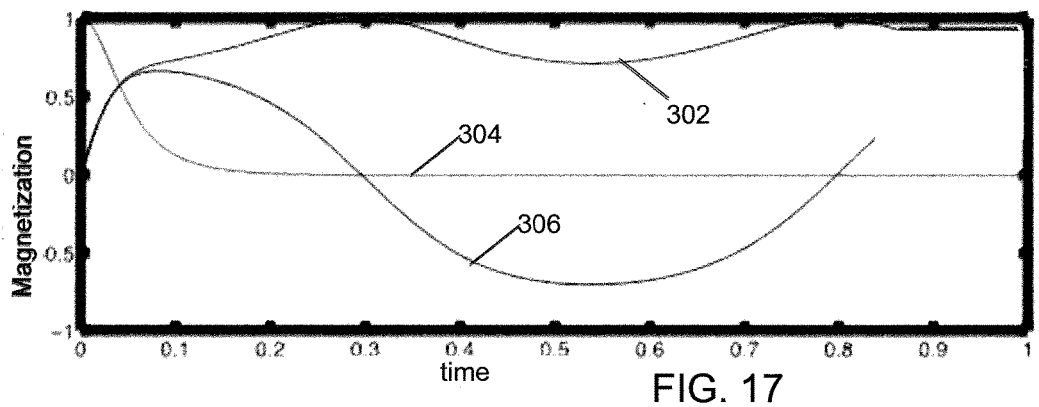
FIG. 17 illustrates relaxation of aligned nanoparticles in an applied field.

Simulation results in FIG. 17 show that with the static field applied in the x-direction, we have what we expect for MSB or MPI: the NPs rotate between fully aligned with the static field, and being off axis upward and downward. We have in effect shifted the zero. In a lesser static field, we could also expect to see oscillations above zero, but not reaching saturation. Curve 302 shows how the x direction magnetization behaves. It does not cancel out, and shows the intuitive dynamics of first aligning with the static field and then oscillating from the new starting point of fully pointed in the x-direction. Note the data are normalized so that the maximum value for the magnetization is unity.

In MRI the strong static or bias field aligns the proton spins and it has been thought that the static field will completely saturate the NP magnetizations so no MPI or MSB signal could be obtained with an MRI-intensity bias field. That is, that saturation precludes MPI or MSB in an MRI. However, we have found that if the alternating field is perpendicular to the static MRI field, some signal can be obtained from the NPs. It is smaller than what could be obtained outside the field but it is there and again it is independent of the alternating field because it is in the direction of the static field. This allows MSB and MPI harmonics to be generated in the static magnetic field of an MRI enabling multimodality systems to function.

Figure 18:
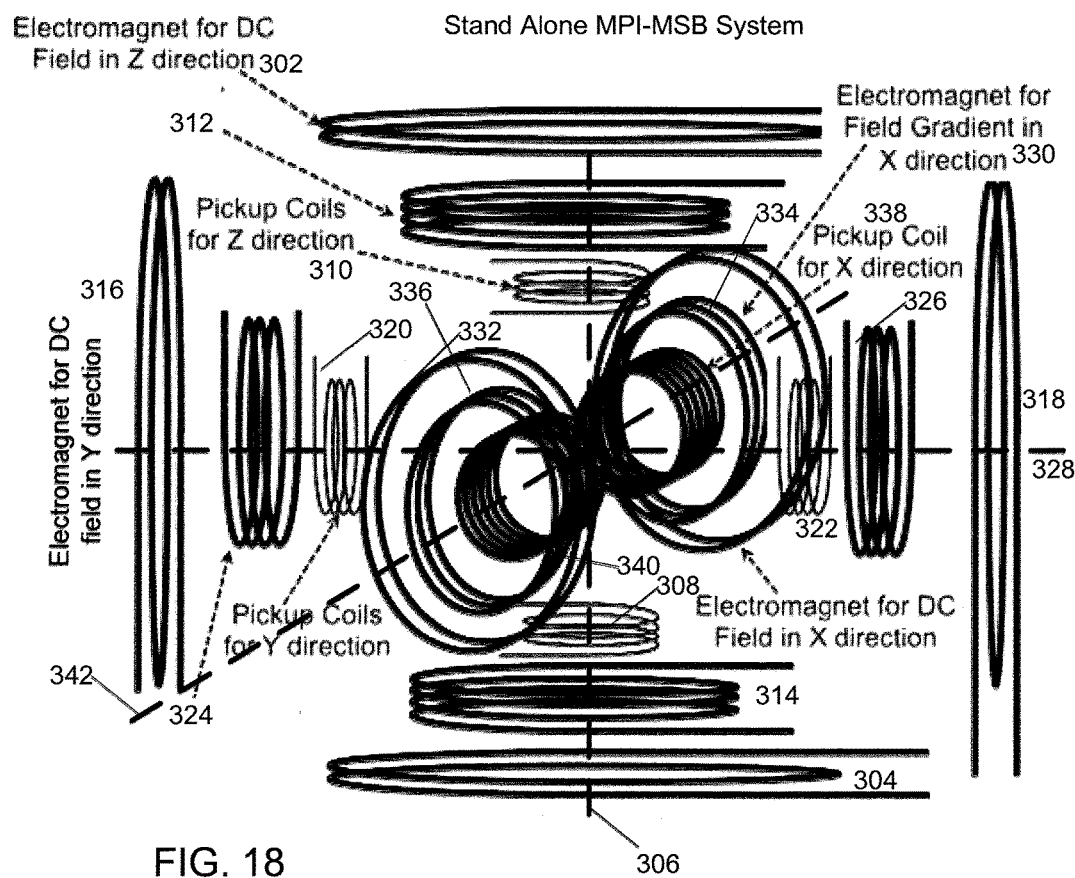
FIG. 18 illustrates a stand-alone, three-dimensional, MSB/MPI machine having static-field electromagnets, oriented along each of three mutually-perpendicular axes, and driving coils, and sensing coils oriented along each of three mutually-perpendicular axes.

Since the alignment of NPs in a strong static magnetic field allows sensing MSB or MPI signals with a sensing coil parallel to the static field, and on an axis perpendicular to the axis of applied AC magnetic field, such that the sensing coil does not respond to the applied AC magnetic field directly, not only may an MSB or MPI system be combined with MRI, but stand-alone MSB/MPI machines may also be designed to take advantage of this. In a stand-alone MSB or MSB-MPI machine strong electromagnets are used to provide a static magnetic field switchable between multiple axes, as illustrated in FIG. 18. In the embodiment of FIG. 18 a first pair of static-field electromagnets 302, 304 are oriented along a first axis 306 (Z axis), together with a pair of sensing coils 308, 310, and a pair of AC driving coils 312, 314. Similarly, a second pair of static-field electromagnets 316, 318, second pair of pickup or sensing coils 320, 322, and AC driving coils 324, 326 oriented along a second axis 328 (Y axis). Similarly a pair of pickup or sensing coils 308, 310, and a pair of AC driving coils 312, 314 are provided centered on a second, perpendicular, axis 306, the Z-axis. Similarly, a third pair of static-field electromagnets 330, 332, third pair of sensing coils 338, 340, and AC driving coils 334, 336 oriented along a third axis 342 (X axis) are provided. Additional trimming coils for fine adjustment of the static fields or for shifting fields to more precisely localize NPs in tissue may be provided, but are not shown for simplicity.

In the machine of FIG. 18, one set of static field electromagnets, such as the Z axis electromagnets 302, 304, is first activated. AC driving coils, such as the AC driving coils 324, 326 oriented along an axis, such as the Y axis 328 perpendicular to the Z axis, are then driven with an AC signal. Additional AC driving coils, such as driving coils 334, 336, also oriented along an axis (X axis) perpendicular to the Z axis may also be activated; activation of X and Y axis driving coils may be done in a sequence of X, both X and Y, and Y coils to alter the axis of drive to help localize NPs. Throughout driving of the X, X and Y, and Y driving coils, and driving of Z axis electromagnets, MSB and MPI signals are received with Z axis sensing coils 320, 322.

The first set of static field electromagnets is then turned off, and a second set of static field electromagnets, such as the X axis electromagnets 330, 332 is activated. AC driving coils, such as AC driving coils 324, 326 oriented along an axis, such as the Y axis 328 perpendicular to the X axis, are then driven with an AC signal. Additional AC driving coils, such as driving coils 312, 314, also oriented along an axis (Z axis) perpendicular to the X axis may also be activated; activation of Y and Z axis driving coils may be done in a sequence of Y, both Y and Z, and Z coils to alter the axis of drive to help localize NPs. Throughout driving of the Y, Z and Y, and Z driving coils, and driving of X axis electromagnets, MSB and MPI signals are received with X axis sensing coils 338, 340.

In embodiments desiring still further information, the second set of static field electromagnets is then turned off, and a third set of static field electromagnets, such as the Y axis electromagnets 316, 318 is activated. AC driving coils, such as AC driving coils 334, 336 oriented along an axis, such as the X axis 328 perpendicular to the Y axis, are then driven with an AC signal. Additional AC driving coils, such as driving coils 312, 314, also oriented along an axis (Z axis) perpendicular to the Y axis may also be activated; activation of X and Z axis driving coils may be done in a sequence of X, both X and Z, and Z coils to alter the axis of drive to help localize NPs. Throughout driving of the X, Z and X, and Z driving coils, and driving of Y axis electromagnets, MSB and MPI signals are received with y axis sensing coils 320, 322.

Figure 20:
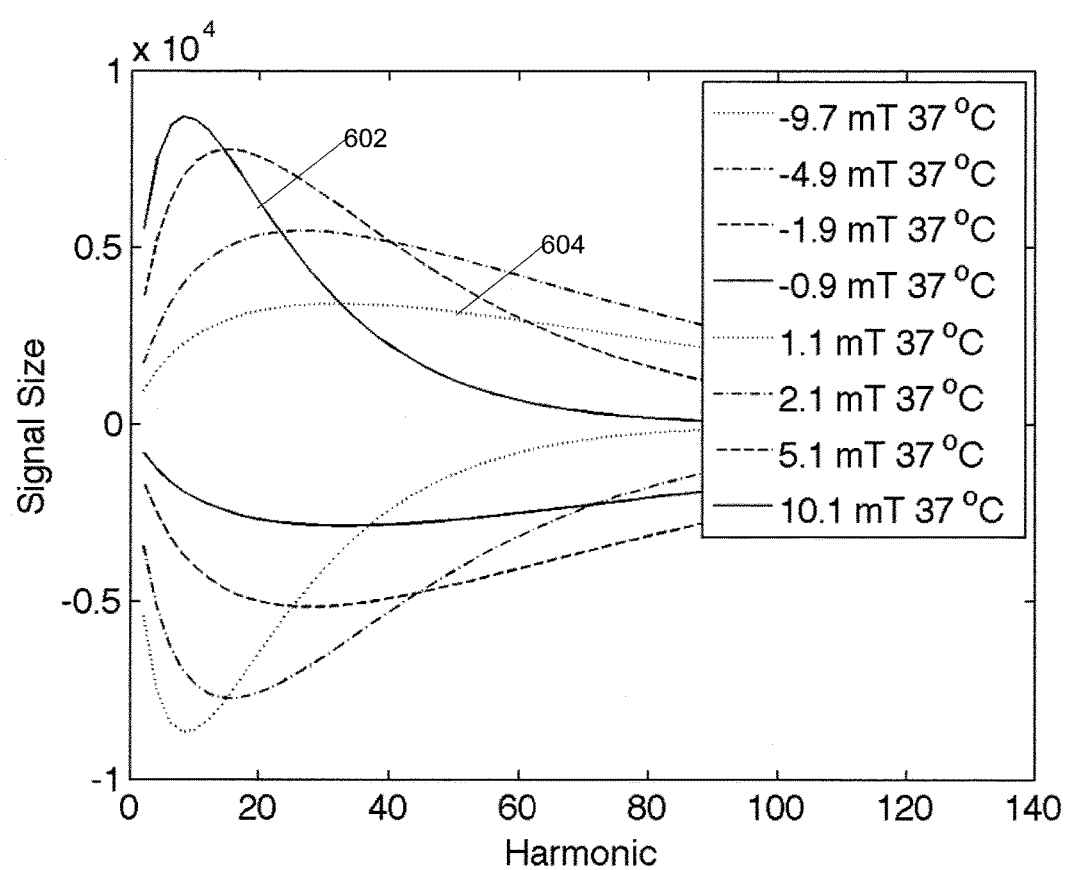
FIG. 20 is an illustration of differences in relative signal strength of harmonics in signal detected due to differences in applied DC magnetic field strength.

Current art MPI systems require very large gradients to saturate the nanoparticles in all regions beyond the field free point; typically a gradient of 3T/m is required. If a uniform alternating field is used with a static field that is a function of position (a gradient) perpendicular to the alternating field and in line with the pickup coils, imaging can be accomplished with much lower static field gradients because the nanoparticles need not be saturated. By modulating the size and direction of the gradients, the unique positions of the nanoparticle spins can be found. The response to the gradient fields in the three directions can be used to encode the position of the nanoparticles. FIG. 20 shows the response to different size static offset fields. From FIG. 20 we can see that nanoparticles in a high-intensity field produce a stronger harmonic distribution with fewer high-order harmonics than low-order harmonics of the AC applied field frequency. Line 602 represents a simulated harmonic response in a 10.1 millitesla bias field, and line 604 represents the harmonic response in a 1.1 millitesla field. Nanoparticles located at each position along the gradient therefore produce a different, linearly independent, combination of harmonics so the number of nanoparticles at each position along the gradient can be found uniquely and with good stability.

With reference to FIG. 18, by applying an AC field along the Y axis, with a static field in the Z axis, whose strength varies along either the X, Y or Z axis (X gradient illustrated in FIG. 15 and Y gradient in FIG. 16), the harmonics produced by nanoparticles in each position along the gradient are different (as illustrated in FIG. 20). One spectrum is obtained with this distribution of static fields. Other spectra are obtained with different spatial distributions of static fields, or field gradients, until enough linearly independent information is obtained to reconstruct the 3D image. The reconstruction can be done using the measured response from a point sample at each position within the volume imaged as is currently done in MPI. The direction of the static field and the direction of the gradient can be changed independently; there are six possible gradient fields: fields in the Z direction varying in the X, Y or Z directions, fields in the Y direction varying in the X, Y or Z directions. In addition, two uniform static fields (in the X and Y directions) are useful to "sweep" the gradient across the subject. Combinations of the eight fields can be used to acquire enough localization information to reconstruct the image. The fields can be applied in discrete combinations or swept slowly across the subject.

Among the differences between the method described and current art is that in the current art, all nanoparticles except those in the field free point are saturated and that saturation provides the spatial localization. Recently a field free line configuration has been suggested and a field free plane configuration has been postulated; no technical reasonable way to produce the field free plane has been suggested to date. However, in all prior cases the localization is provided by saturating most of the nanoparticles in the volume imaged. The proposed method acquires signal from all the nanoparticles in the volume all the time with minor exceptions if some nanoparticles are incidentally saturated. The localization information is provided by the orientation and size of the magnetization produced by static fields perpendicular to the alternating field. In essence, the signal is produced by the static field/alternating field combination rather than being selectively saturated.

Figure 14:
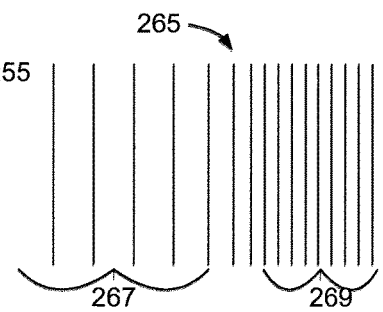
FIG. 14 is a schematic illustration of a field gradient having a zone of sharp field change in a system for performing MPI.

To improve resolution of multiple nanoparticle concentrations along the X axis, the gradient can be configured, using additional coils, as having a zone 265 (FIG. 14) of steep gradient between two zones 267, 269 of mild gradient, and the zone of steep gradient can then be swept along the X axis while repeating steps of taking data with a sense coil oriented to pick up signals along the perpendicular (Z) axis to record the combination of harmonics produced by nanoparticles, and analyzing the recorded harmonics. Location of multiple nanoparticle concentrations along that X axis can therefore be resolved.

By changing the gradient having a steep portion from along the X-axis to one along the Y axis, and changing the AC field to along the X axis, and repeating (iterating) the sweeping of the gradient, taking of data, and analyzing the recorded harmonics, the nanoparticle concentration can be located along the Y axis. Similarly, by using a gradient with a steep zone, and sweeping the steep zone across the subject, locations and shapes of multiple nanoparticle concentrations can be resolved.

The same data applies to the other spatial directions so each position in 3D can be uniquely solved. The size and direction of the gradients can be changed to increase the stability of the solution for higher spatial resolutions.

Once obtained, the locations of multiple nanoparticle concentrations in each axis (X, Y, and Z) can be processed to construct a three-dimensional model of nanoparticle concentrations in the subject, and this data is displayed as a tomographic image. Further, this three-dimensional model of nanoparticle concentrations is annotated into data obtained through a second imaging modality, such as MRI or CT scan, and this data is also displayed as tomographic images.

Figure 19:
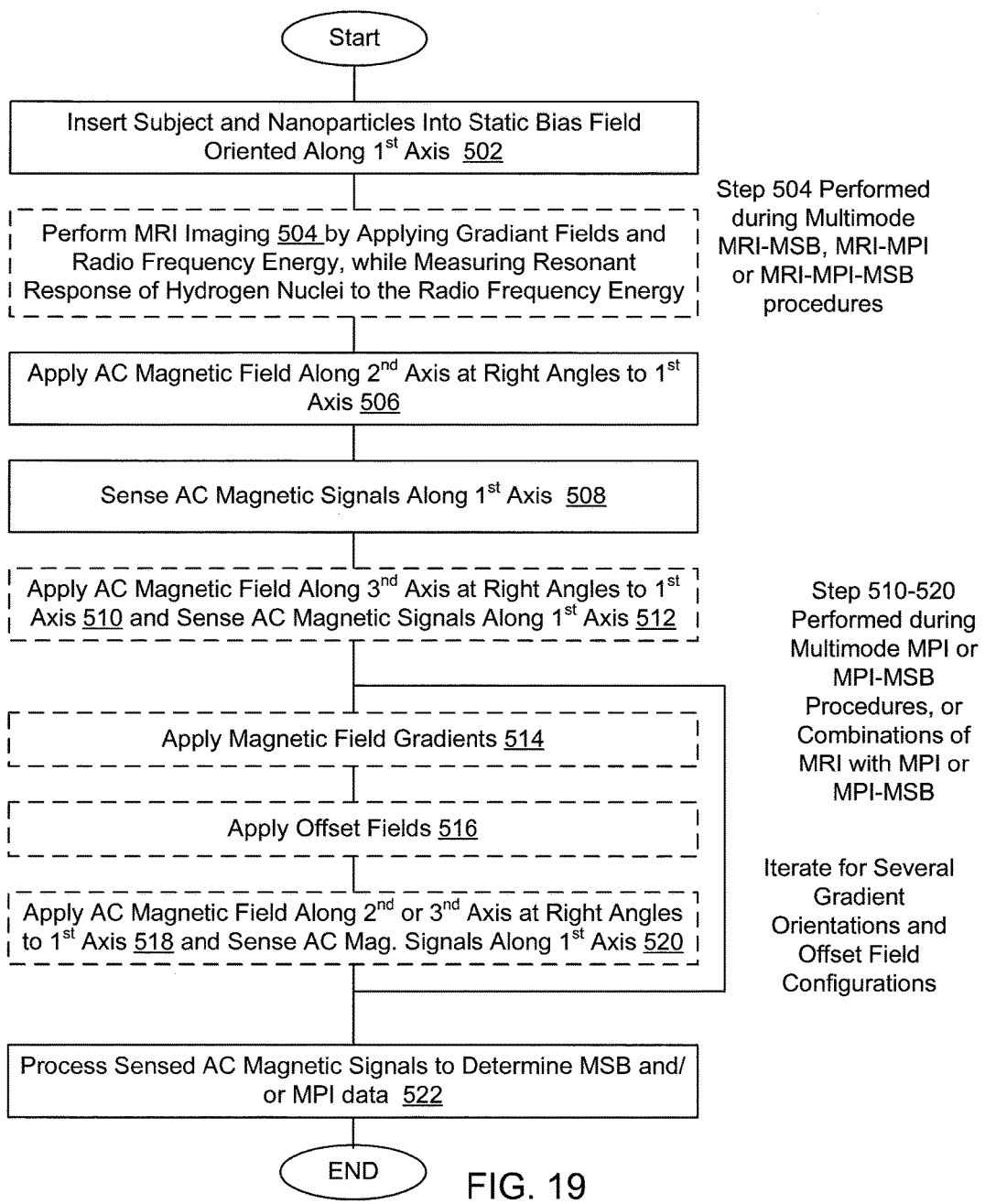
FIG. 19 is a flowchart of the method herein described of obtaining a multimode MRI and MSB/MPI result, or of obtaining an improved MSB/MPI result, from nanoparticles in a subject.

The apparatus herein described is configured to perform a method as heretofore described and as illustrated with reference to FIG. 19. In the method, magnetic NPs, which may be tagged NPs, are administered to a subject. The subject, with NPs, is then positioned 502 in a static bias magnetic field, such as that provided by magnets 202, 229, 250, 251, or 302-304, the field is oriented along a first axis. If a multimode imaging including MRI is to be performed, the static bias magnetic field is a bias field of an MRI system and MRI imaging is performed 504 as known in the art of MRI imaging.

Once MRI imaging 504 is complete, the MRI gradient magnets, and radio frequency source are shut down. Within milliseconds or at most a few minutes, and without repositioning the subject, an AC magnetic field is applied 506 along an axis perpendicular to the first axis. A response of the NPs to the AC magnetic field is sensed or received 508 by a pickup or sense coil, such as sense coil 224, 225, 260, 257, 308, or 310, oriented to respond to field fluctuations along the first axis while ignoring field fluctuations along the second axis.

In embodiments capable of MPI, an additional AC magnetic field may be applied 510 along a third axis perpendicular to the first axis, and a response is sensed by the sense coil oriented to respond to field fluctuations along the first axis. A gradient may also be applied 514 to the bias magnetic field, as may be done by energizing gradient electromagnets, and DC offset fields 516, AC magnetic fields applied 518 along the second or third axis, and additional responses sensed 520 by the sense coil oriented to respond to field fluctuations along the first axis.

Magnetic signals as sensed by the sense coils are processed 522 by a signal processing subsystem, such as AC signal receivers 226 and processor 228, to determine magnetic nanoparticle data including the MSB response and/or MPI map of NP location.

Perpendicular Axis Measurement of Resonant Precession of Néel-Relaxing Nanoparticles In addition to a Brownian signal, largely due to physical rotation of nanoparticles, a Néel relaxation may also exist, and can be particularly prominent with small nanoparticles. Brownian signals tend to be more prominent among larger nanoparticles. Both mechanisms will be measured using the previously described methods. But a second type of detection is possible: this second type of signal can be measured in the perpendicular direction because the magnetizations of nanoparticles that are relaxing with the Néel relaxation mechanism precess, and may radiate, with a frequency proportional to the field applied. Néel relaxation signals have been reported from small nanoparticles in the literature. This Néel precession can be detected at the magnetization-dependent resonant frequency for each nanoparticle, and is due to a shift in magnetization due to a shift in electron structure of the nanoparticle rather than a mechanical flipping of the nanoparticle as with MSB. This NMR-like precessional signal may be useful for sensing and imaging in vitro or in vivo.

In an embodiment, an AC magnetic field is applied 506 along an axis, such as axis 220, perpendicular to the first axis, and a DC magnetic bias field is provided along the first axis, such as axis 222. A Néel-relaxation response of the nanoparticles to the AC magnetic field is sensed or received by a pickup or sense coil, such as sense coil 224, oriented to respond to field fluctuations along the first axis while ignoring field fluctuations along the second axis.

Same Axis Signal Detection with Bridge Circuitry

In performing magnetic nanoparticle imaging, and in measuring MSB signals from low concentrations of magnetic nanoparticles, it is desirable that the sensing coil arrangements and electronics are sensitive to nanoparticle signals, yet resistant to extraneous signals and to the fundamental AC excitation signal.

There are two signals which can be of interest in various embodiments of MPI-MSB systems. Among these is a signal, notable at a fundamental of the AC excitation signal although higher harmonics are present, that is detectable by coils along the same axis as an AC excitation signal, and this signal may be detectable by an excitation coil itself. The other is the MSB signal detectable by coils oriented on an axis perpendicular to the axis of excitation coils.

In a high-sensitivity embodiment for magnetic nanoparticle imaging, for sensing along the same axis as AC excitation, a sensing coil 702 (FIG. 21) is coupled in series with a balancing coil 704 in a coil assembly 706 that may also contain a magnetic bias field coil 708. The coil assembly is configured such that sensing coil 702 is located closer to, or surrounds, a sample 710 or tissue that may contain magnetic nanoparticles, while balancing coil 704 is located further from the sample or tissue, such that magnetic properties of the nanoparticles affect properties, such as inductance, of the sensing coil more than they affect properties of the balancing coil. In some embodiments, the sample 710 is tissue of a subject, the tissue containing magnetic nanoparticles, with some portions of the tissue containing higher concentrations of magnetic nanoparticles than other portions of the tissue.

A center-tap connection 712 between the sensing coil 702 and balancing coil 704 is coupled to a sense input to a differential amplifier 714. A reference input to the differential instrumentation amplifier 714 is coupled to a tap node 716 that is connected to two resistors 718, 720. One resistor 718 is connected, along with a terminal of one of the sensing or balancing coils, to an AC signal source 722, the other resistor 720 is coupled, along with a remaining terminal of the sensing or balancing coils, to a second terminal of the AC signal source 722. In a particular embodiment, the second terminal of the AC signal source 722 is a circuit ground 724. At least one of the resistors 718, 720 is an adjustable resistor. The combination of resistors 720, 718, sensing coil 702, and balance coil 704, are referenced herein as a magnetic sensing bridge.

Figure 21:
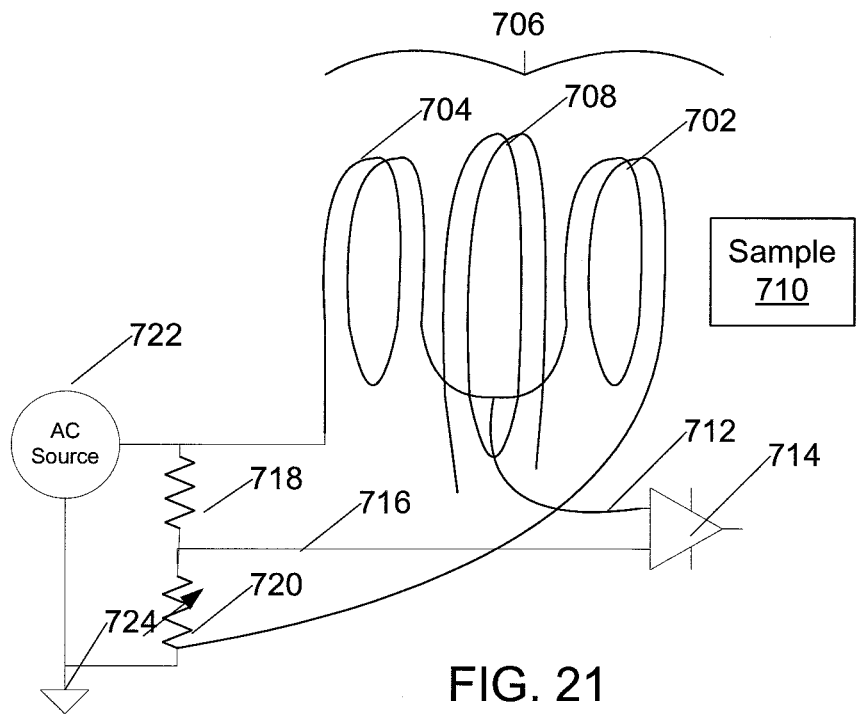
FIG. 21 is an illustration of a bridge circuit useful for sensing magnetic nanoparticles.

In an embodiment, the adjustable resistor of the sensing circuit of FIG. 21 is carefully adjusted, or balanced, such that, when the AC signal source is active, a difference between AC signals at the tap node 716 and the center tap 712 is a predetermined difference level that corresponds to no magnetic nanoparticles near sensing coil 702; in a particular embodiment the predetermined difference level is near or at a zero signal level. When nanoparticles are near sensing coil 702, the magnetic properties of the particles unbalance the magnetic sensing bridge, causing the difference between difference between AC signals at the tap node 716 and the center tap 712 to change, hence changing an output signal of the instrumentation amplifier to a "magnetic nanoparticles present" level. In a particular embodiment, adjustable resistor 720 incorporates a "ten-turn" potentiometer that permits precise adjustment, or balancing, of the circuit.

With the magnetic sensing bridge of FIG. 21, it is not necessary to build sensing and balancing coil pairs that precisely cancel each other's induced potentials, a task that is can be difficult to achieve to the level of precision that is normally required for sensitive nanoparticle measurements. The excitation signal from signal source 722 can be eliminated from the output by adjusting the resistive portion of the bridge and therefore compensate for differences between sensing 702 and balance 704 coils. This, we expect, will increase our sensitivity to nanoparticle concentration measurements by a very large factor. In this configuration, we have split the entire excitation coils effectively into two inductors by center tapping it and configuring the resulting two inductors as part of a bridge, with one inductor sensing the field disturbance caused by a nanoparticle suspension while the other senses the same field undisturbed, for enhancing sensitivity to magnetic nanoparticles at fundamental frequency.

Figure 22:
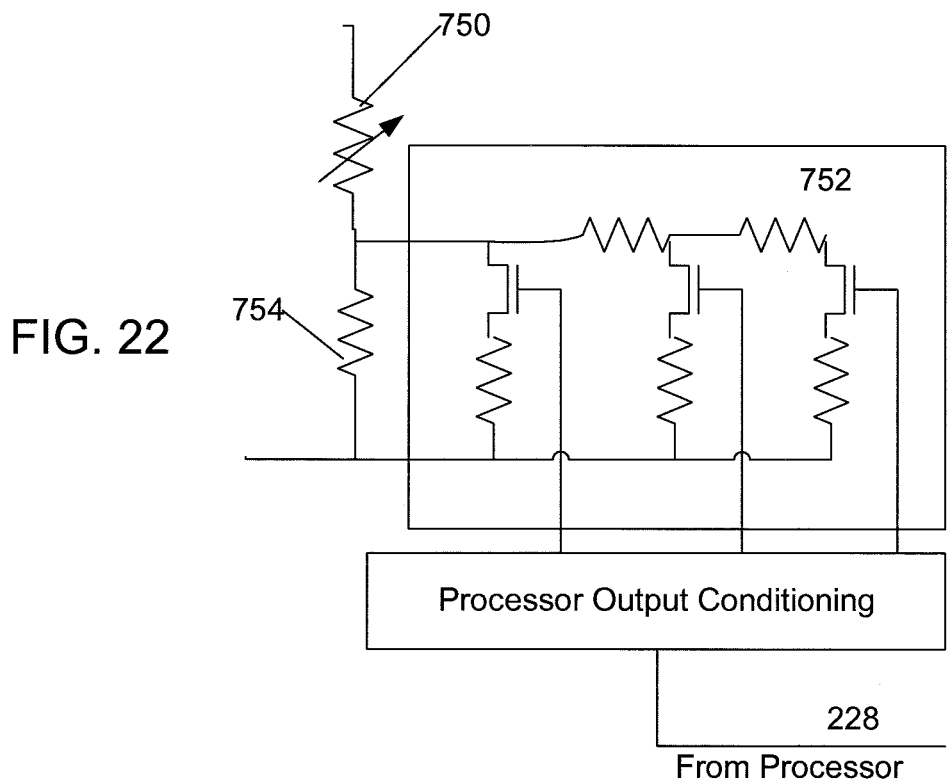
FIG. 22 is a schematic diagram of a program-controllable autobalancing circuit for use in the bridge circuit of FIG. 21.

In an alternative embodiment, the variable resistor, such as resistor 720, of the circuit of FIG. 21 is replaced with an electronically-variable resistance assembly, such as illustrated in FIG. 22. In the variable assembly of FIG. 22, a manual range-setting resistor 750 is in series with a resistive digital-to-analog converter 752 (RDAC), which in an embodiment may be a resistive DAC of the conventional R-2R ladder type. While only three bits are shown, RDAC 752 may have any cost-effective number of bits; RDACs are commonly available with twelve or more bits of resolution. RDAC 752 may be in parallel with a fixed range-determining resistor 754.

In an embodiment, each AC signal receiver 226 of a system for detecting and localizing magnetic nanoparticles in a subject, as illustrated in FIG. 3, incorporates a bridge circuit of FIG. 21, where sensing coils 224 are sensing coils 702. In this embodiment, the bridge circuits of FIG. 21 incorporate the electronically-variable resistance assembly of FIG. 22, where the RDAC 752 of each sensing circuit is coupled to processor 228 (FIG. 3), as auto-adjustment DACs 227 (FIG. 3), such that processor 228 can adjust the circuit null for any magnetic effects of subject or tissue 204 prior to injection of the magnetic nanoparticles.

AC signal and amplifiers 226 also has filtering circuits to permit any signal detectable at harmonics, such as a third harmonic, of the fundamental frequency provided by AC signal source 722.

Reduction of Fundamental Component on Perpendicular Axes

When an AC magnetic field is applied by AC drive coils 258 (FIG. 12) oriented along one axis such as axis 274, and an MSB signal is sensed along a perpendicular axis like axis 254, such as by coils 224, there may be some fundamental signal coupled from drive coils 258 to coils 224 despite the perpendicular orientation of the axes. This coupling may result from magnetic objects in, or in walls of, an examination room, from screws of examination tables, and other nearby objects as well as magnetic nanoparticles in the subject and inevitable wire bends.

Figure 23:
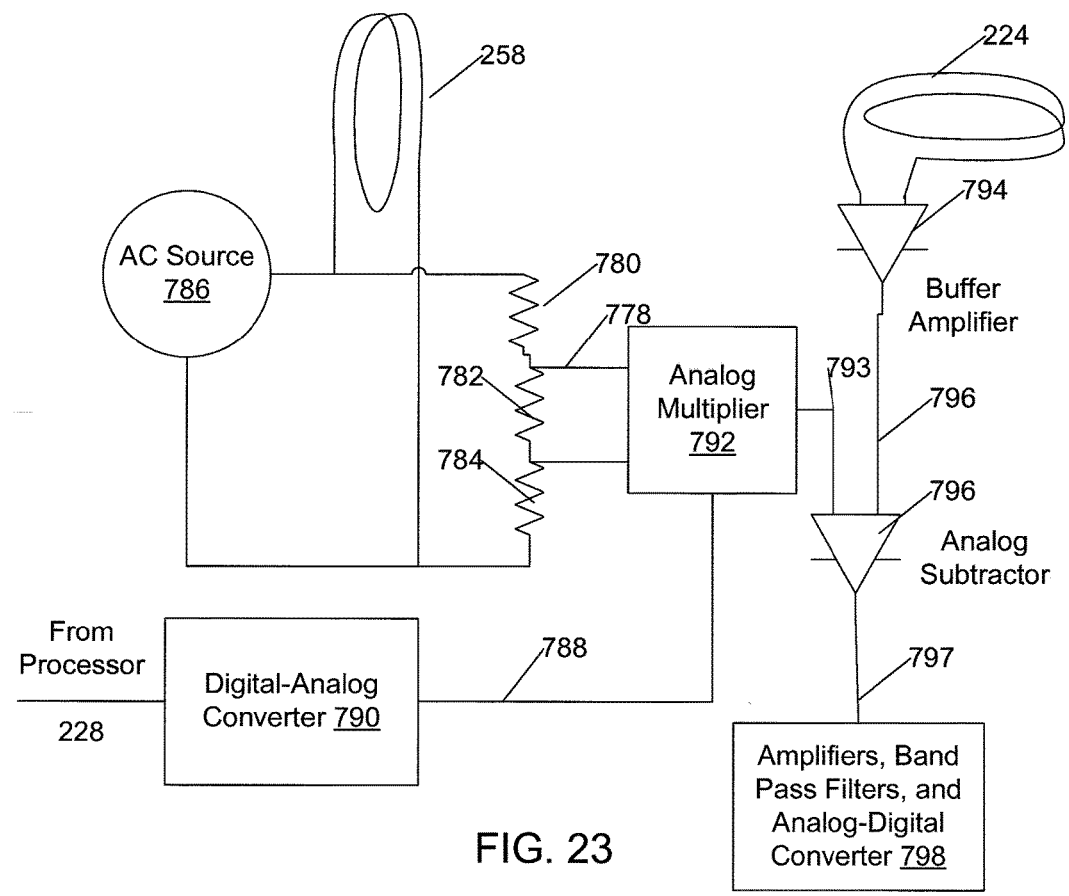
FIG. 23 is a schematic diagram of a circuit for cancelling stray coupling from AC driving coils into perpendicular sensing coils.

In order to compensate for such stray coupling of fundamental signal from driving coils 258 to perpendicular sensing coils 224, a reference signal 778 is tapped by three resistors 780, 782, 784 coupled in series across the AC drive 786 to driving coils 258 (FIG. 23). Digital compensation control signals from processor are converted to an analog control level 788 by a digital to analog converter 790. The analog control level 788 is multiplied by the reference signal 778 in an analog multiplier 792 to produce a compensation signal 793. Meanwhile, a sense signal from perpendicular sensing coil 224 is buffered by an amplifier 794 and then passed through an analog subtractor or differential amplifier 796, where the compensation signal 793 is subtracted, to provide a compensated signal 797. Compensated signal 797 is further processed by amplifiers, band-pass filters, and analog-to-digital converters 798 (ADCs) that are also part of AC signal receivers and amplifiers 226, digital outputs of the ADCs are provided to processor 228 so that the processor can extract MSB signal information.

Néel Relaxation Signals in Same Axis as Applied AC Magnetic Field

In some embodiments, a Néel Relaxation signal may be found in the same axis as the applied AC magnetic field; this signal is weak, however, when compared to the applied field strength. The actively-nulled bridge circuit of FIGS. 21 and 22 may, however, sufficiently reduce the fundamental signal that this relaxation signal can be detected. In an embodiment, an AC magnetic field is applied along an axis, such as axis 220, perpendicular to the first axis, and a DC magnetic bias field is provided along the first axis, such as axis 222. A Néel-relaxation response of the nanoparticles to the AC magnetic field is sensed or received by a pickup or sense coil, such as sense coil 208, 210, oriented to respond to field fluctuations along the first axis—the axis of the AC field.

Combinations

Components of the system for Magnetic Particle Imaging with and without MSB and/or MRI may be combined in many ways. Among these are combinations as follows:

A system designated A for measuring a response of magnetic nanoparticles in an imaging zone has a static magnet configured to provide a static bias field oriented parallel to a first axis, the static bias field passing through the imaging zone; at least a first driving coil configured to provide an alternating magnetic field along a second axis, the alternating magnetic field passing through the imaging zone, the second axis perpendicular to the first axis; apparatus for providing at least one static magnetic field gradient with the field oriented along the first or second axis, and the gradient in the field along at least one axis selected from the first axis, the second axis, and a third axis mutually perpendicular to the first and second axis; at least one sensing coil oriented to provide a detected signal by sensing changes in a magnetic field parallel to the first axis, and further oriented to minimize sensing of changes in a magnetic field parallel to the second axis; and a signal processing subsystem configured to determine a response of magnetic nanoparticles in the imaging zone to the AC magnetic field based upon the detected signal.

A system designated AAA including the system designated A wherein the field of the magnetic field gradient is oriented along the second axis.

A system designated AAB including the system designated A or AAA wherein the field of the magnetic field gradient has a gradient along the second axis.

A system designated AAC including the system designated A wherein the field of the magnetic field gradient is oriented along the first axis.

A system designated AA including the system designated A, AAA, AAB, or AAC wherein the static magnet is configured to provide a bias field of strength greater than or equal to two ten thousandths tesla.

A system designated AB including the system designated A or AA wherein the static magnet is configured to provide a bias field of strength greater than or equal to two tenths tesla.

A system designated AC including the system designated A, AAB, AAC, or AB wherein the static magnet is a main magnet of a magnetic resonance imaging system, and further comprising apparatus for applying radio frequency signals to tissue and apparatus for sensing a response of tissue to the radio frequency signals.

A system designated AD including the system designated A, AAA, AAB, AAC, AA, AB, or AC wherein the signal processing subsystem is configured to determine a voxel-based model of magnetic nanoparticle distribution in the imaging zone.

A system designated AE including the system designated AD wherein the voxel-based model is three-dimensional.

A system designated AF including the system designated A, AAA, AAB, AAC, AA, AB, AC, AD, or AE further including at least a second AC driving coil configured to provide an AC magnetic field along the third axis, the AC magnetic field passing through the imaging zone, and comprising apparatus allowing the direction of an alternating field resulting from energizing the first and second AC driving coils to be steered electronically. A system designated AG including the system designated A, AAA, AAB, AAC, AA, AB, AC, AD, AE, or AG wherein the at least one sensing coil is electrically coupled to a center tap node, the center tap node being coupled to a balance coil disposed to be less sensitive to magnetic nanoparticles in the imaging zone than is the sensing coil, and the center tap node is coupled to an input of a differential amplifier; and wherein a first resistor is electrically coupled between a second input of the differential amplifier and across the sensing coil; and a second resistor between the second input of the differential amplifier and across the balance coil; and wherein at least one of the first and second resistors is an adjustable resistor.

A system designated AH including the system designated AG wherein the adjustable resistor is automatically adjusted.

A method designated B of producing magnetic nanoparticle data includes applying a DC bias magnetic field along a first axis to nanoparticles in a sensing zone; applying an AC magnetic field along a second axis to the nanoparticles, the second axis perpendicular to the first axis; while the DC and AC magnetic fields are applied, sensing a response from the nanoparticles with a sensing coil oriented to respond primarily to field perturbations along the first axis, while minimizing response to field perturbations along the third second axis; and processing the sensed response to provide the nanoparticle data.

A method designated BA including the method designated B wherein the nanoparticle data comprises magnetic spectroscopy of Brownian motion data.

A method designated BB including the method designated B or BA further including determining a voxel-based model of nanoparticle distribution in the sensing zone.

A method designated BC including the method designated B, BA, or BB, and further including applying a second AC magnetic field along a third axis to the nanoparticles, the third axis perpendicular to the first axis; and while the DC and second AC magnetic fields are applied, sensing a response from the nanoparticles with a sensing coil oriented to respond primarily to field perturbations along the first axis, while minimizing response to field perturbations along the third axis.

A method designated BD including the method designated B, BA, BB, or BC, wherein the nanoparticle data comprises Magnetic Spectroscopy of Brownian motion data A method designated BE including the method designated B, BA, BB, BC, or BD wherein the nanoparticle data comprises magnetic particle imaging data.

A method designated BF including the method designated B, BA, BB, BC, BD, or BE wherein the DC magnetic field has strength at least two tenths millitesla.

A method designated BG including the method designated BE wherein the DC magnetic field has strength at least two tenths tesla.

A method designated BH including the method designated B, BA, BB, BC, BD, BE, BF, or BG wherein the nanoparticle data comprises a signal from magnetic nanoparticles that relax with the Néel relaxation mechanism at a resonant frequency of the nanoparticles.

A method designated BI including the method designated B, BA, BB, BC, BD, BE, BF, or BG wherein the sensing coils are sensed with a bridge circuit.

Changes may be made in the above methods and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall there between.

What is claimed is:

1. A system for measuring a response of magnetic nanoparticles in an imaging zone comprises:
   a static magnet configured to provide a static bias field oriented parallel to a first axis, the static bias field passing through the imaging zone;
   at least a first driving coil configured to provide an alternating current (AC) magnetic field along a second axis, the alternating magnetic field passing through the imaging zone, the second axis perpendicular to the first axis;
   apparatus for providing at least one static magnetic field gradient with the field oriented along an axis selected from the first and second axis, and the gradient in the field along at least one axis selected from the group consisting of the first axis, the second axis, and a third axis mutually perpendicular to the first and second axis;
   at least one sensing coil oriented to provide a detected signal by sensing changes in a magnetic field parallel to the first axis, and further oriented to minimize sensing of changes in a magnetic field parallel to the second axis; and
   a signal processing subsystem configured to determine the response of magnetic nanoparticles in the imaging zone to the AC magnetic field based upon the detected signal.

2. The system of claim 1 wherein the field of the magnetic field gradient is oriented along the second axis.

3. The system of claim 2 wherein the field of the magnetic field gradient has a gradient along the second axis.

4. The system of claim 1 wherein the field of the magnetic field gradient is oriented along the first axis.

5. The system of claim 3 wherein the static magnet is configured to provide a bias field of strength greater than or equal to two ten-thousandths tesla.

6. The system of claim 5 wherein the static magnet is configured to provide a bias field of strength greater than or equal to two tenths tesla.

7. The system of claim 4 wherein the static magnet is a main magnet of a magnetic resonance imaging system, and further comprising apparatus for applying radio frequency signals to tissue and apparatus for sensing a response of tissue to the radio frequency signals.

8. The system of claim 5 wherein the signal processing subsystem is configured to determine a voxel-based model of magnetic nanoparticle distribution in the imaging zone.

9. The system of claim 8 wherein the voxel-based model is three-dimensional.

10. The system of claim 5 further comprising at least a second AC driving coil configured to provide an AC magnetic field along the third axis, the AC magnetic field passing through the imaging zone, and comprising apparatus allowing the direction of an alternating field resulting from energizing the first and second AC driving coils to be steered electronically.

11. The system of claim 5 wherein the at least one sensing coil is electrically coupled to a center tap node, the center tap node being coupled to a balance coil disposed to be less sensitive to magnetic nanoparticles in the imaging zone than is the sensing coil, and the center tap node is coupled to an input of a differential amplifier; and
wherein a first resistor is electrically coupled between a second input of the differential amplifier and across the sensing coil; and a second resistor between the second input of the differential amplifier and across the balance coil; and
wherein at least one of the first and second resistors is an adjustable resistor.

12. The system of claim 11 wherein the adjustable resistor is automatically adjusted.

13. A method of producing magnetic nanoparticle data comprising:
applying a DC bias magnetic field along a first axis to nanoparticles in a sensing zone;
applying an AC magnetic field along a second axis to the nanoparticles, the second axis perpendicular to the first axis;
while the DC and AC magnetic fields are applied, sensing a response from the nanoparticles with a sensing coil oriented to respond primarily to field perturbations along the first axis, while minimizing response to field perturbations along the second axis;
processing the sensed response to provide the magnetic nanoparticle data.

14. The method of claim 13 further comprising determining a voxel-based model of nanoparticle distribution in the sensing zone.

15. The method of claim 13, further comprising:
applying a second AC magnetic field along a third axis to the nanoparticles, the third axis perpendicular to the first axis; and
while the DC and second AC magnetic fields are applied, sensing a response from the nanoparticles with a sensing coil oriented to respond primarily to field perturbations along the first axis, while minimizing response to field perturbations along the third axis.

16. The method of claim 13, wherein the nanoparticle data comprises magnetic spectroscopy of Brownian motion data.

17. The method of claim 15 wherein the nanoparticle data comprises magnetic particle imaging data.

18. The method of claim 15 wherein the DC magnetic field has strength at least two-tenths millitesla.

19. The method of claim 18 wherein the DC magnetic field has strength at least two-tenths tesla.

20. The method of claim 18, wherein the nanoparticle data comprises a signal from magnetic nanoparticles that relaxes with the Neel relaxation mechanism at a resonant frequency of the nanoparticles.

21. The system of claim 1 further comprising an array of adjustment coils to adjust the static field on the first axis and the AC field on the second axis to be more perpendicular to each other at each time during the cycle of the AC field.

22. A method of diagnosis comprising the method of claim 14 and further comprising before obtaining the magnetic nanoparticle data:
positioning a subject for imaging;
adjusting circuit null to remove any magnetic effects of tissue of the subject prior to injection of the magnetic nanoparticles; and
injecting the magnetic nanoparticles.

* * * * *